US007394904B2

(12) United States Patent
Bruno et al.

(10) Patent No.: US 7,394,904 B2
(45) Date of Patent: Jul. 1, 2008

(54) METHOD AND DEVICE FOR CONTROL OF A UNIT FOR REPRODUCTION OF AN ACOUSTIC FIELD

(76) Inventors: Rémy Bruno, 23,avenue Eva Salmon, 94400 Vitry sur Seine (FR); Arnaud Laborie, 24bis, rue Arego, 94400 Vitry sur Seine (FR); Sébastien Montoya, 4,rue Gaston Pinot, 75019 Paris (FR)

( * ) Notice: Subject to any disclaimer, the term of this patent is extended or adjusted under 35 U.S.C. 154(b) by 540 days.

(21) Appl. No.: 10/505,852

(22) PCT Filed: Feb. 25, 2003

(86) PCT No.: PCT/FR03/00607

§ 371 (c)(1), (2), (4) Date: Aug. 26, 2004

(87) PCT Pub. No.: WO03/073791

PCT Pub. Date: Sep. 4, 2003

(65) Prior Publication Data

US 2005/0238177 A1 Oct. 27, 2005

(30) Foreign Application Priority Data

Feb. 28, 2002 (FR) .................................. 02 02585

(51) Int. Cl.
*H03G 3/00* (2006.01)

(52) U.S. Cl. ........................................... 381/61; 381/18

(58) Field of Classification Search ............. 381/17–19, 381/56, 307, 61, 63, 98

See application file for complete search history.

(56) References Cited

U.S. PATENT DOCUMENTS

| | | | | | |
|---|---|---|---|---|---|
| 5,598,478 | A * | 1/1997 | Tanaka et al. | 381/17 |
| 5,684,881 | A * | 11/1997 | Serikawa et al. | 381/86 |
| 5,946,400 | A * | 8/1999 | Matsuo | 381/17 |
| 6,078,669 | A * | 6/2000 | Maher | 381/17 |
| 6,154,549 | A | 11/2000 | Arnold et al. | |
| 6,195,435 | B1 * | 2/2001 | Kitamura | 381/18 |
| 6,259,795 | B1 | 7/2001 | McGrath | |
| 7,027,600 | B1 * | 4/2006 | Kaji et al. | 381/17 |
| 2001/0038702 | A1 * | 11/2001 | Lavoie et al. | 381/307 |

FOREIGN PATENT DOCUMENTS

| | | |
|---|---|---|
| WO | WO 94/24835 | 10/1994 |
| WO | WO 97/24012 | 7/1997 |

* cited by examiner

*Primary Examiner*—Lun-See Lao
(74) *Attorney, Agent, or Firm*—Young & Thompson

(57) ABSTRACT

Said method for control of a reproduction unit (2) for an acoustic field with a number of reproduction elements ($\mathbf{3}_1$ to $\mathbf{3}_N$) is characterised in comprising: a step for establishing a finite number of coefficients representative of the temporal distribution and in the three spatial dimensions of said acoustic field, a step for determination of representative reconstruction filters for said reproduction unit (2) and at least the spatial configuration of said reproduction unit (2); a step for determination of at least on control signal ($SC_1$ to $SC_N$) for said elements ($\mathbf{3}_1$ to $\mathbf{3}_N$) by the application of said coefficients to said reconstruction filters and a step for providing said at least one control signal for application to said elements ($\mathbf{3}_1$ to $\mathbf{3}_N$) for generation of said acoustic field for reproduction.

35 Claims, 8 Drawing Sheets

METHOD AND DEVICE FOR CONTROL OF A UNIT FOR REPRODUCTION OF AN ACOUSTIC FIELD

BACKGROUND OF THE INVENTION

The present invention relates to a method and a device for control of a reproduction unit for an acoustic field.

DESCRIPTION OF THE RELATED ART

Sound is a wavelike acoustic phenomenon which evolves over time and in space. The existing techniques act mainly on the temporal aspect of sounds, the processing of the spatial aspect being very incomplete.

Specifically, the existing high-quality reproduction systems actually necessitate a predetermined spatial configuration of the reproduction unit.

For example, so-called multichannel systems address different and predetermined signals to several loudspeakers whose distribution is fixed and known.

Likewise, so-called “ambisonic” systems, which consider the direction from which the sounds which reach a listener originate, require a reproduction unit whose configuration must comply with certain positioning rules.

In these systems, the sound environment is regarded as an angular distribution of sound sources about a point, corresponding to the listening position. The signals correspond to a decomposition of this distribution over a basis of directivity functions called spherical harmonics.

In the current state of development of these systems, good-quality reproduction is possible only with a spherical distribution of loudspeakers and a substantially regular angular distribution.

Thus, when the existing techniques are implemented with a reproduction unit whose spatial distribution is arbitrary, the quality of reproduction is greatly impaired, in particular on account of angular distortions.

Recent technical developments make it possible to consider a modeling in time and in the three dimensions in space of an acoustic field rather than the angular distribution of the sound environment.

In particular, the doctoral thesis “Représentation de champs acoustiques, application à la transmission et à la reproduction de scènes sonores complexes dans un contexte multimédia” [Representation of acoustic fields, application to the transmission and to the reproduction of complex sound scenes in a multimedia context] Université Paris VI, Jérôme Daniel, of 11 Jul. 2000, defines functions describing the wavelike characteristics of an acoustic field and allowing decomposition over a basis of functions of space and time which completely describes a three-dimensional acoustic field.

However, in this document, the theoretical solutions are inspired by the so-called “Ambisonic” systems and high-quality reproduction can be obtained only for the 5 existing regular spherical distributions. No element makes it possible to ensure high-quality reproduction with the help of an arbitrary spatial configuration of the reproduction unit.

It is therefore apparent that no system of the prior art makes it possible to perform quality reproduction with the help of an arbitrary spatial configuration of the reproduction unit.

SUMMARY OF THE INVENTION

The aim of the invention is to remedy this problem by providing a method and a device for determining signals for controlling a reproduction unit for restoring an acoustic field whose spatial configuration is arbitrary.

A subject of the invention is a method of controlling a reproduction unit for restoring an acoustic field so as to obtain a reproduced acoustic field of specific characteristics substantially independent of the intrinsic characteristics of reproduction of said unit, said reproduction unit comprising a plurality of reproduction elements, characterized in that it comprises at least:

a step of establishing a finite number of coefficients representative of the distribution in time and in the three dimensions in space of said acoustic field to be reproduced;

a step of determining reconstruction filters representative of said reproduction unit, comprising a substep of taking into account at least spatial characteristics of said reproduction unit;

a step of determining at least one control signal for said elements of said reproduction unit, said at least one signal being obtained by the application, to said coefficients, of said reconstruction filters; and a step of delivering said at least one control signal, with a view to an application to said reproduction elements so as to generate said acoustic field reproduced by said reproduction unit.

According to other characteristics:

said step of establishing a finite number of coefficients representative of the distribution of said acoustic field to be reproduced comprises:

a step consisting in providing an input signal comprising temporal and spatial information for a sound environment; and a step of shaping said input signal by decomposing said information over a basis of spatio-temporal functions, this shaping step making it possible to deliver a representation of said acoustic field to be reproduced corresponding to said sound environment in the form of a linear combination of said functions;

said step of establishing a finite number of coefficients representative of the distribution of said acoustic field to be reproduced comprises:

a step consisting in providing an input signal comprising a finite number of coefficients representative of said acoustic field to be reproduced in the form of a linear combination of spatio-temporal functions;

said spatio-temporal functions are so-called Fourier-Bessel functions and/or linear combinations of these functions;

said substep of taking into account at least spatial characteristics of said reproduction unit is carried out at least with the help of parameters representative, for each element, of the three coordinates of its position with respect to the center placed in the listening zone, and/or of its spatio-temporal response;

said substep of taking into account at least spatial characteristics of said reproduction unit is carried out moreover with the help:

of parameters describing, in the form of weighting coefficients, a spatial window which specifies the distribution in space of reconstruction constraints for the acoustic field; and of a parameter describing an order of operation limiting the number of coefficients to be taken into account during said step of determining reconstruction filters;

said substep of taking into account at least spatial characteristics of said reproduction unit is carried out moreover with the help:

of parameters constituting a list of spatio-temporal functions whose reconstruction is imposed; and of a parameter describing an order of operation limiting the number of coefficients to be taken into account during said step of determining reconstruction filters;

said step of taking into account at least spatial characteristics of said reproduction unit is carried out moreover at least with the help of one of the parameters chosen from the group consisting:

of parameters representative of at least one of the three coordinates of the position of each or some of the elements, with respect to the center placed in the listening zone;

of parameters representative of the spatio-temporal responses of each or some of the elements;

of a parameter describing an order of operation limiting the number of coefficients to be taken into account during said step of determining reconstruction filters;

of parameters constituting a list of spatio-temporal functions whose reconstruction is imposed;

of parameters representative of the templates of said reproduction elements;

of a parameter representative of the desired local capacity of adaptation to the spatial irregularity of the configuration of said reproduction unit;

of a parameter defining the radiation model for said reproduction elements;

of parameters representative of the frequency response of said reproduction elements;

of a parameter representative of a spatial window;

of parameters representative of a spatial window in the form of weighting coefficients; and of a parameter representative of the radius of a spatial window when the latter is a ball;

the method comprises a calibration step making it possible to deliver all or part of the parameters used in said step of determining reconstruction filters;

said calibration step comprises, for at least one of the reproduction elements:

a substep of acquiring signals representative of the radiation of said at least one element in the listening region; and a substep of determining spatial and/or acoustic parameters of said at least one element;

said calibration step comprises:

a substep of emitting a specific signal to said at least one element of said reproduction unit, said acquisition substep corresponding to the acquisition of the sound wave emitted in response by said at least one element; and a substep of transforming said signals acquired into a finite number of coefficients representative of the sound wave emitted, so as to allow the carrying out of said substep of determining spatial and/or acoustic parameters;

said acquisition substep corresponds to a substep of receiving a number of coefficients representative of the acoustic field generated by said at least one element in the form of a linear combination of spatio-temporal functions, which coefficients are used directly during said substep of determining spatial and/or acoustic parameters of said at least one element;

said calibration substep furthermore comprises a substep of determining the position in at least one of the three dimensions in space of said at least one element of said reproduction unit;

said calibration step furthermore comprises a substep of determining the spatio-temporal response of said at least one element of said reproduction unit;

said calibration step furthermore comprises a substep of determining the frequency response of said at least one element of said reproduction unit;

the method comprises a step of simulating all or part of the parameters necessary for carrying out said step of determining reconstruction filters;

said simulation step comprises:

a substep of determining missing parameters from among the parameters used during said step of determining reconstruction filters;

a plurality of calculation substeps making it possible to determine the value or values of the missing parameter or parameters as defined previously as a function of the parameters received, of the frequency, and of predetermined default parameters;

said simulation step comprises a substep of determining a list of elements of the reproduction unit that are active as a function of the frequency, and said calculation substeps are carried out just for the elements of said list;

said simulation step comprises a substep of calculating a parameter representative of the order of operation limiting the number of coefficients to be taken into account during said step of determining reconstruction filters with the help of at least the position in space of all or part of the elements of the reproduction unit;

said simulation step comprises a step of determining parameters representative of a spatial window in the form of weighting coefficients with the help of a parameter representative of the spatial window in the spherical reference frame and/or of a parameter representative of the radius of said spatial window when the latter is a ball;

said simulation step comprises a substep of determining a list of spatio-temporal functions whose reconstruction is imposed with the help of the position of all or part of the elements of the reproduction unit;

the method comprises a step of input making it possible to determine all or part of the parameters used during said step of determining reconstruction filters;

said step of determining reconstruction filters comprises:

a plurality of calculation substeps carried out for a finite number of frequencies of operation and making it possible to deliver a matrix for weighting the acoustic field, a matrix representative of the radiation of the reproduction unit, and a matrix representative of the spatio-temporal functions whose reconstruction is imposed; and a substep of calculating a decoding matrix, carried out for a finite number of operating frequencies, with the help of the matrix for weighting the acoustic field, of the matrix representative of the radiation of the reproduction unit, of the matrix representative of the spatio-temporal functions whose reconstruction is imposed, and of a parameter representative of the desired local capacity of adaptation to the spatial irregularity of the reproduction unit, representative of the reconstruction filters;

said calculation substep making it possible to deliver a matrix representative of the radiation of the reproduction unit is carried out with the help of parameters representative for each element:

of the three coordinates of its position with respect to the center placed in the listening zone; and/or of its spatio-temporal response; and said calculation substep making it possible to deliver a matrix representative of the radiation of the reproduction unit is carried out moreover with the help of parameters representative for each element of its frequency response.

A subject of the invention is also a computer program comprising program code instructions for the execution of the steps of the method when said program is executed on a computer.

A subject of the invention is also a removable medium of the type comprising at least one processor and a nonvolatile memory element, characterized in that said memory comprises a program comprising instructions for the execution of the steps of the method when said processor executes said program.

The subject of the invention is also a device for controlling a reproduction unit for restoring an acoustic field, comprising a plurality of reproduction elements, characterized in that it comprises at least:

means of determining reconstruction filters representative of said reproduction unit, adapted so as to make it possible to take into account at least spatial characteristics of said reproduction unit; and means for determining at least one control signal for said elements of said reproduction unit, said at least one signal being obtained by application of said reconstruction filters to a finite number of coefficients representative of the distribution in time and in the three dimensions in space of said acoustic field to be reproduced.

According to other characteristics of the invention:

the device is associated with means for shaping an input signal comprising temporal and spatial information for a sound environment to be reproduced, which means are adapted for decomposing said information over a basis of spatio-temporal functions so as to deliver a signal comprising said finite number of coefficients representative of the distribution in time and in the three dimensions in space of said acoustic field to be reproduced, corresponding to said sound environment, in the form of a linear combination of said spatio-temporal functions;

said spatio-temporal functions are so-called Fourier-Bessel functions and/or linear combinations of these functions;

said means for determining reconstruction filters receive as input at least one of the parameters from the following parameters:

parameters representative of at least one of the three coordinates of the position of each or some of the elements, with respect to the center placed in the listening zone;

parameters representative of the spatio-temporal responses of each of some of the elements;

a parameter describing an order of operation limiting the number of coefficients to be taken into account in the means of determining reconstruction filters;

parameters representative of the templates of said reproduction elements;

a parameter representative of the desired local capacity of adaptation to the spatial irregularity of the configuration of said reproduction unit;

a parameter defining the radiation model for said reproduction elements;

parameters representative of the frequency response of said reproduction elements;

a parameter representative of a spatial window;

parameters representative of a spatial window in the form of weighting coefficients;

parameters representative of the radius of a spatial window when the latter is a ball; and parameters constituting a list of spatio-temporal functions whose reconstruction is imposed;

each of said parameters received by said means of determining reconstruction filters is conveyed by one of the signals from the group of the following signals:

a definition signal comprising information representative of the spatial characteristics of the reproduction unit;

a supplementary signal comprising information representative of the acoustic characteristics associated with the elements of the reproduction unit; and an optimization signal comprising information relating to an optimization strategy, so as to deliver, with the aid of the parameters contained in these signals, a signal representative of said reconstruction filters representative of said reproduction unit;

the device is associated with means for determining all or part of the parameters received by said means for determining reconstruction filters, said means comprising at least one of the following elements:

simulation means;

calibration means;

parameters input means;

said means for determining reconstruction filters are adapted for determining a set of filters representative of the position in space of the elements of the reproduction unit; and said means of determining reconstruction filters are adapted for determining a set of filters representative of the room effect induced by the listening zone.

BRIEF DESCRIPTION OF THE DRAWINGS

The invention will be better understood on reading the description which follows, given merely by way of example and while referring to the appended drawings, in which.

DESCRIPTION OF THE PREFERRED EMBODIMENTS

Figure 1:
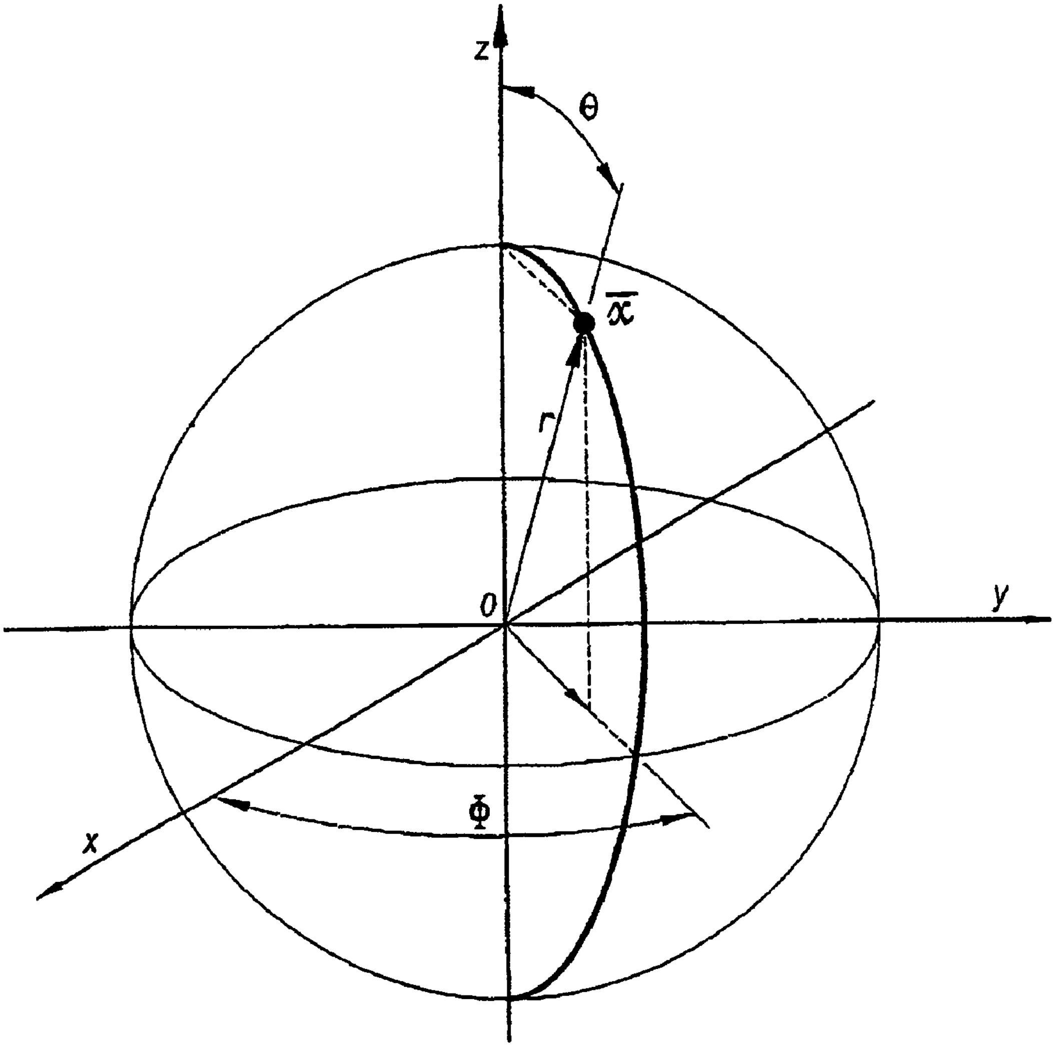
FIG. 1 is a representation of a spherical reference frame.

Represented in FIG. 1 in such a way as to specify the system of coordinates to which reference is made in the text is a conventional spherical reference frame.

This reference frame is an orthonormal reference frame, with origin O and comprising three axes (OX), (OY) and (OZ).

In this reference frame, a position denoted $\bar{x}$ is described by means of its spherical coordinates $(r,\theta,\phi)$, where r designates the distance with respect to the origin O and $\theta$ the orientation in the vertical plane and $\phi$ the orientation in the horizontal plane.

In such a reference frame, an acoustic field is known if at each instant t the acoustic pressure denoted p(r,θ,ϕ,t), whose temporal Fourier transform is denoted P(r,θ,ϕ,f) where f designates the frequency, is defined at every point.

Figure 2:
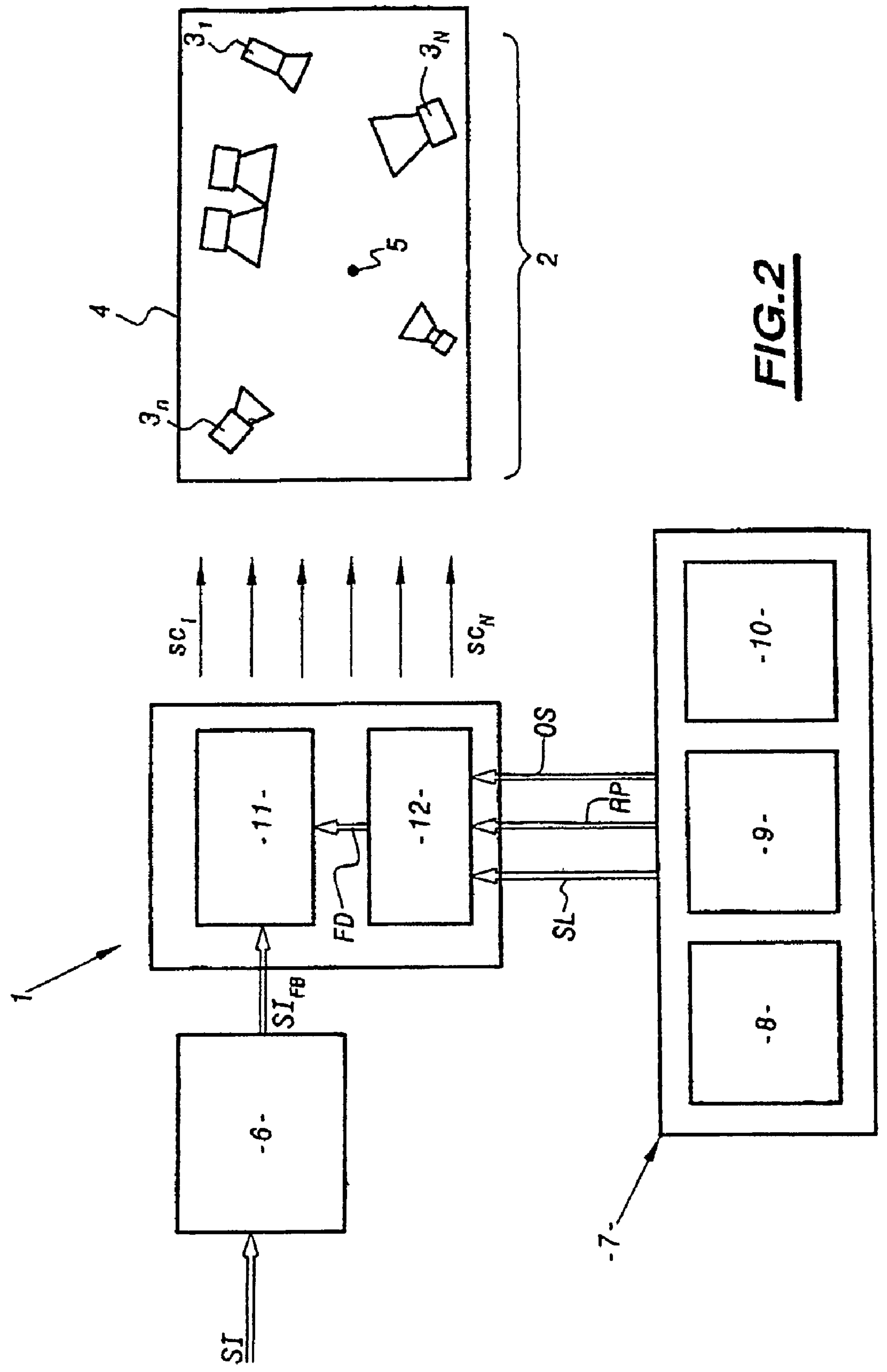
FIG. 2 is a diagram of a reproduction system according to the invention.

FIG. 2 is a representation of a reproduction system according to the invention.

This system comprises a decoder 1 controlling a reproduction unit 2 which comprises a plurality of elements $\mathbf{3}_1$ to $\mathbf{3}_N$, such as loudspeakers, acoustic enclosures or any other sound source, arranged in an arbitrary manner in a listening region 4. The origin O of the reference frame, referred to as the center 5 of the reproduction unit, is placed arbitrarily in the listening region 4.

Together, the set of spatial, acoustic and electrodynamic characteristics is considered to be the intrinsic characteristics of reproduction.

The system also comprises means 6 for shaping an input signal SI and means 7 for generating parameters comprising means 8 of simulation, means 9 of calibration and means 10 of inputting parameters.

The decoder 1 comprises means 11 for determining control signals and means 12 for determining reconstruction filters.

The decoder 1 receives as input a signal $SI_{FB}$ comprising information representative of the three-dimensional acoustic field to be reproduced, a definition signal SL comprising information representative of the spatial characteristics of the reproduction unit 2, a supplementary signal RP comprising information representative of the acoustic characteristics associated with the elements $\mathbf{3}_1$ to $\mathbf{3}_N$ and an optimization signal OS comprising information relating to an optimization strategy.

The decoder emits a specific control signal $sc_1$ to $sc_N$ destined for each of the elements $\mathbf{3}_1$ to $\mathbf{3}_N$ of the reproduction unit 2.

Figure 3:
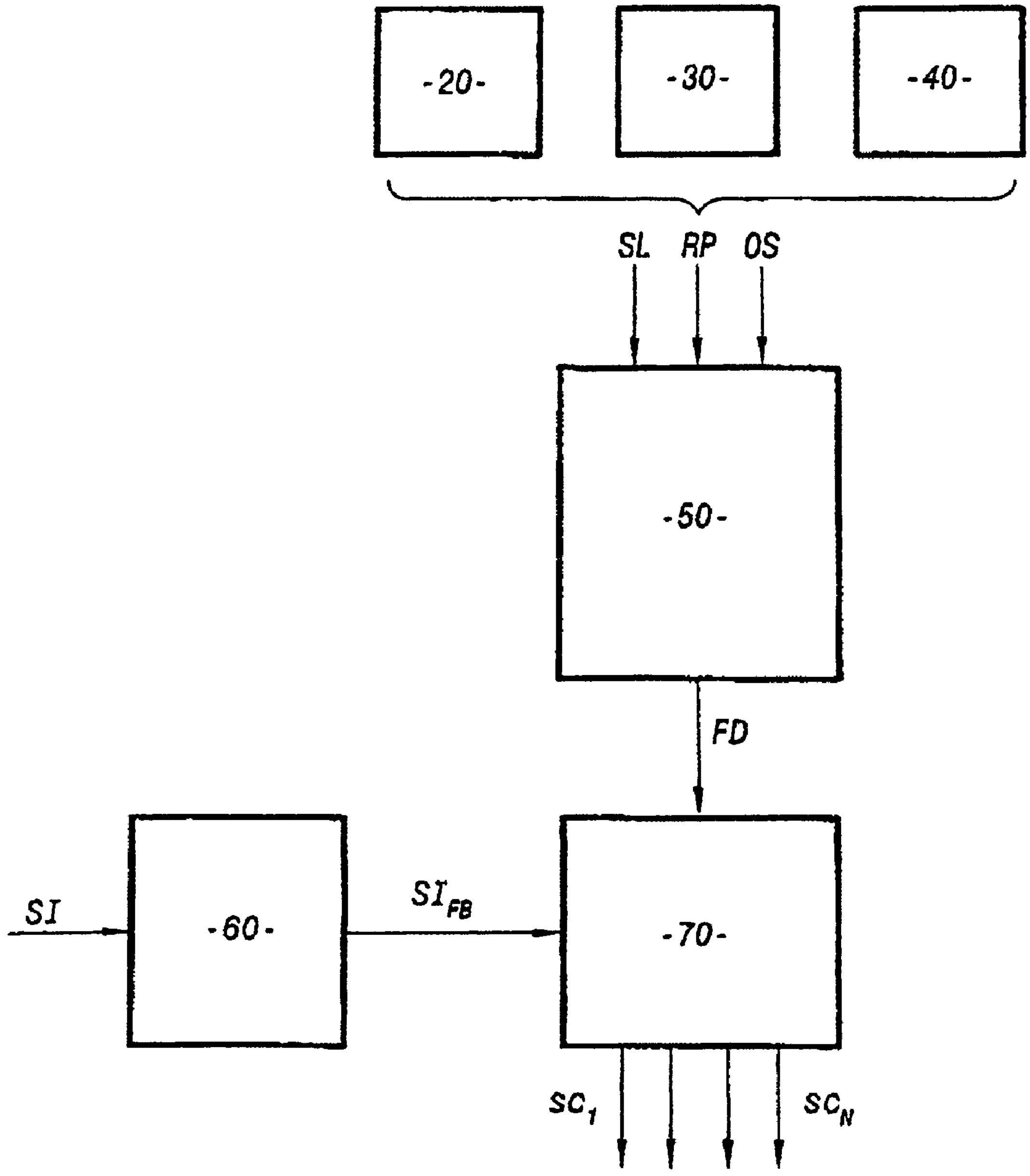
FIG. 3 is a schematic diagram of the method of the invention.

Represented diagrammatically in FIG. 3 are the main steps of the method implemented in a system according to the invention as described with reference to FIG. 2.

The method comprises a step 20 of inputting optimization parameters, a step 30 of calibration making it possible to measure certain characteristics of the reproduction unit 2 and a simulation step 40.

During the parameters input step 20 implemented by the interface means 10, certain parameters of the operation of the system may be defined manually by an operator or be delivered by a suitable device.

During the calibration step 30, described in greater detail with reference to FIGS. 4 and 5, the calibration means 9 are linked in turn one by one with each of the elements $\mathbf{3}_1$ to $\mathbf{3}_N$ of the reproduction unit 2 so as to measure parameters associated with these elements.

The simulation step 40, implemented by the means 8, makes it possible to simulate the signals of parameters necessary for the operation of the system which are neither input during step 20 nor measured during step 30.

The means 7 for generating parameters then deliver as output the definition signal SL, the supplementary signal RP and the optimization signal OS.

Thus, steps 20, 30 and 40 make it possible to determine the set of parameters necessary for the implementation of step 50.

Following these steps, the method comprises a step 50 of determining reconstruction filters that is implemented by the means 12 of the decoder 1 and makes it possible to deliver a signal FD representative of the reconstruction filters.

This step 50 of determining reconstruction filters makes it possible to take into account the at least spatial characteristics of the reproduction unit 2 that are defined during the steps 20 of input, 30 of calibration or 40 of simulation. Step 50 also makes it possible to take into account the acoustic characteristics associated with the elements $\mathbf{3}_1$ to $\mathbf{3}_N$ of the reproduction unit 2 and the information relating to an optimization strategy.

The reconstruction filters obtained on completion of step 50 are subsequently stored in the decoder 1 so that steps 20, 30, 40 and 50 are repeated only in case of modification of the reproduction unit 2 or of the optimization strategies.

During operation, the signal SI comprising temporal and spatial information of a sound environment to be reproduced, is provided to the shaping means 6, for example by direct acquisition or by reading a recording or by synthesis with the aid of computer software. This signal SI is shaped during a shaping step 60. On completion of this step, the means 6 deliver to the decoder 1 a signal $SI_{FB}$ comprising a finite number of coefficients representative, over a basis of spatio-temporal functions, of the distribution in time and in the three dimensions in space, of an acoustic field to be reproduced corresponding to the sound environment to be reproduced.

As a variant, the signal $SI_{FB}$ is provided by exterior means, for example a microcomputer comprising synthesis means.

The invention is based on the use of a family of spatio-temporal functions making it possible to describe the characteristics of any acoustic field.

In the embodiment described, these functions are so-called spherical Fourier-Bessel functions of the first kind subsequently referred to as Fourier-Bessel functions.

In a zone devoid of sound sources and devoid of obstacles, the Fourier-Bessel functions are solutions of the wave equation and constitute a basis which spans all the acoustic fields produced by sound sources situated outside this zone.

Any three-dimensional acoustic field is therefore expressed as a linear combination of Fourier-Bessel functions, according to the expression for the inverse Fourier-Bessel transform which is expressed as:

$$P(r,\theta,\phi,f) = 4\pi\sum_{l=0}^{\infty}\sum_{m=-l}^{l} P_{l,m}(f)j^l j_l(kr)y_l^m(\theta,\phi)$$

In this equation, the terms $P_{l,m}(f)$ are, by definition, the Fourier-Bessel coefficients of the field p(r,θ,ϕ,t), $$k = \frac{2\pi f}{c},$$

c is the speed of sound in air (340 $ms^{-1}$), $j_l(kr)$ is the spherical Bessel function of the first kind of order l defined by $$j_l(x) = \sqrt{\frac{\pi}{2x}}J_{l+1/2}(x)$$

where $J_v(x)$ is the Bessel function of the first kind of order v, and $y_l^m(\theta,\phi)$ is the real spherical harmonic of order l and of term m, with m ranging from −1 to 1, defined by:

$$y_l^m(\theta,\phi)=\begin{cases}\frac{1}{\sqrt{\pi}}P_l^{|m|}(\cos\theta)\cos(m\phi) & \text{for } m>0\\ \frac{1}{\sqrt{2\pi}}P_l^{0}(\cos\theta) & \text{for } m=0\\ \frac{1}{\sqrt{\pi}}P_l^{|m|}(\cos\theta)\sin(m\phi) & \text{for } m<0\end{cases}$$

In this equation, the $P_l^m(x)$ are the associated Legendre functions defined by:

$$P_l^m(x)=\sqrt{\frac{2l+1}{2}}\sqrt{\frac{(l-m)!}{(l+m)!}}(1-x^2)^{m/2}\frac{d^m}{dx^m}P_l(x)$$

with $P_l(x)$ the Legendre polynomials, defined by:

$$P_l(x)=\frac{1}{2^l l!}\frac{d^l}{dx^l}(x^2-1)^l$$

The Fourier-Bessel coefficients are also expressed in the temporal domain by the coefficients $p_{l,m}(t)$ corresponding to the inverse temporal Fourier transform of the coefficients $P_{l,m}(f)$.

As a variant, the method of the invention uses function bases expressed as linear combinations, possibly infinite, of Fourier-Bessel functions.

During the shaping step 60, carried out by the means 6, the input signal SI is decomposed into Fourier-Bessel coefficients $p_{l,m}(t)$ in such a way as to establish the coefficients forming the signal $SI_{FB}$.

The decomposition into Fourier-Bessel coefficients is conducted up to a limit order L defined previously to this shaping step 60 during the input step 20.

On completion of step 60, the signal $SI_{FB}$ delivered by the shaping means 6 is introduced into the means 11 for determining the control signals. These means 11 also receive the signal FD representative of the reconstruction filters defined by taking account in particular of the spatial configuration of the reproduction unit 2.

The coefficients of the signal $SI_{FB}$, delivered on completion of step 60, are used by the means 11 during a step 70 of determining the control signals $sc_1$ to $sc_N$ for the elements of the reproduction unit 2 with the help of the application of the reconstruction filters determined during step 50 to these coefficients.

The signals $sc_1$ to $sc_N$ are then delivered so as to be applied to the elements $3_1$ to $3_N$ of the reproduction unit 2 which reproduce the acoustic field whose characteristics are substantially independent of the intrinsic characteristics of reproduction of the reproduction unit 2.

By virtue of the method of the invention, the control signals $sc_1$ to $sc_N$ are adapted to allow optimal reproduction of the acoustic field which best utilizes the spatial and/or acoustic characteristics of the reproduction unit 2, in particular the room effect, and which integrates the chosen optimization strategy.

Thus, on account of the quasi-independence between the intrinsic characteristics of reproduction of the reproduction unit 2 and of the acoustic field reproduced, it is possible to render the latter substantially identical to the acoustic field corresponding to the sound environment represented by the temporal and spatial information received as input.

The main steps of the method of the invention will now be described in greater detail.

During step 20 of inputting parameters an operator or a suitable memory system can specify all or part of the calculation parameters and in particular:

- $x_n$, representative of the position of element $\mathbf{3}_n$ with respect to the listening center 5; $x_n$ being expressed in the spherical reference frame by means of the coordinates $r_n$, $\theta_n$, and $\phi_n$;
- $G_n(f)$, representative of the template of element $\mathbf{3}_n$ of the reproduction unit specifying the frequency band of operation of this element;
- $N_{l,m,n}(f)$, representative of the spatio-temporal response of the element $\mathbf{3}_n$ corresponding to the acoustic field produced in the listening region 4 by the element $\mathbf{3}_n$, when the latter receives an impulse signal as input;
- W(r,f), describing for each frequency f considered a spatial window representative of the distribution in space of constraints of reconstruction of the acoustic field, these constraints making it possible to specify the distribution in space of the effort of reconstruction of the acoustic field;
- $W_l(f)$, describing directly in the form of weighting of the Fourier-Bessel coefficients and for each frequency f considered, a spatial window representative of the distribution in space of constraints of reconstruction of the acoustic field;
- R(f), representative, for each frequency f considered, of the radius of the spatial window when the latter is a ball;
- $H_n(f)$, representative, for each frequency f considered, of the frequency response of element $\mathbf{3}_n$;
- $\mu(f)$, representative for each frequency f considered, of the desired local capacity of adaptation to the spatial irregularity of the configuration of the reproduction unit;
- $\{(l_k,m_k)\}(f)$, constituting for each frequency f considered, a list of spatio-temporal functions whose reconstruction is imposed;
- L(f), imposing, for each frequency f considered, the limit order of operation of the means 12 of determining reconstruction filters;
- RM(f), defining, for each frequency f considered, the radiation model for the elements $\mathbf{3}_1$ to $\mathbf{3}_N$ of the reproduction unit 2.

The definition signal SL conveys the parameters $x_n$, the supplementary signal RP, the parameters $H_n(f)$ and $N_{l,m,n}(f)$ and the optimization signal OS, the parameters $G_n(f)$, $\mu(f)$, $\{(l_k,m_k)\}(f)$, L(f), W(r,f), $W_l(f)$, R(f) and RM(f).

The interface means 10 implementing this step 20 are conventional type means such as a microcomputer or any other appropriate means.

Step 30 of calibration and the means 9 which implement it will now be described in greater detail.

Figure 4:
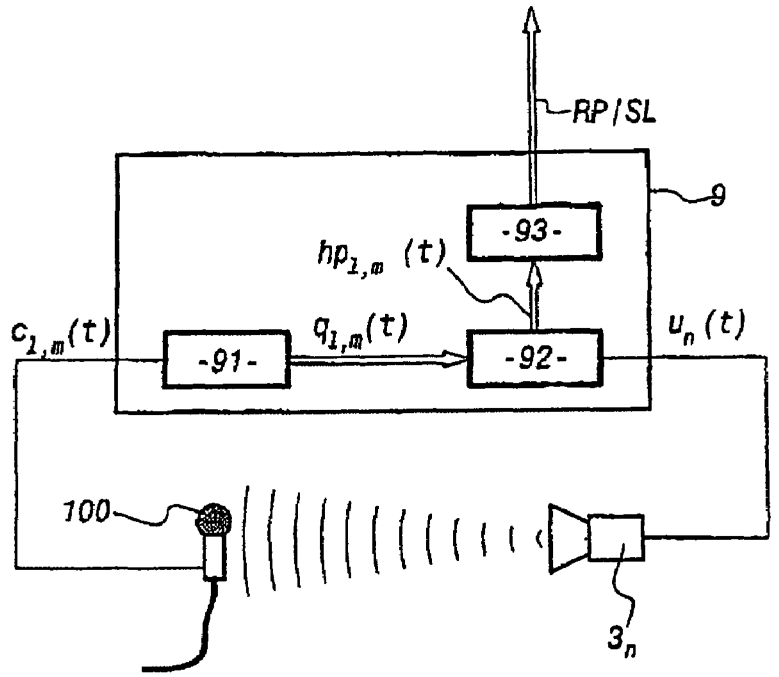
FIG. 4 is a diagram detailing the calibration means.

Represented in FIG. 4 are the details of the calibration means 9. They comprise a decomposition module 91, a module 92 for determining impulse response and a module 93 for determining calibration parameters.

The calibration means 9 are adapted to be connected to a sound acquisition device 100 such as a microphone or any other suitable device, and to be connected in turn one by one to each element $\mathbf{3}_n$ of the reproduction unit 2 so as to tap information off from this element.

Figure 5:
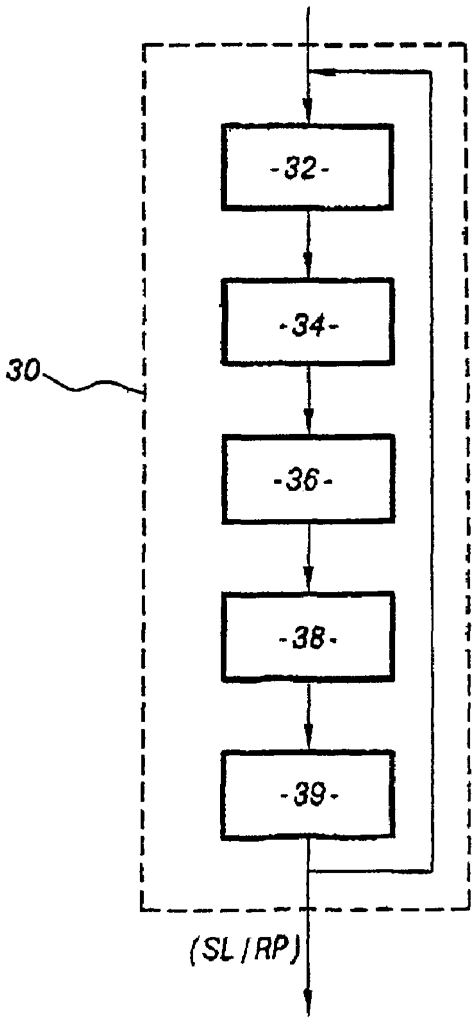
FIG. 5 is a diagram detailing the calibration step.

Represented in FIG. 5 are the details of a mode of embodiment of the calibration step 30 implemented by the calibration means 9 and making it possible to measure characteristics of the reproduction unit 2.

During a substep 32, the calibration means 9 emit a specific signal $u_n(t)$ such as a pseudo-random sequence MLS (Maximum Length Sequence) destined for an element $\mathbf{3}_n$. The acquisition device 100 receives, during a substep 34, the sound wave emitted by the element $\mathbf{3}_n$ in response to the receipt of the signal $u_n(t)$ and transmits signals $c_{l,m}(t)$ representative of the wave received to the decomposition module 91.

During a substep 36, the decomposition module 91 decomposes the signals picked up by the acquisition device 100 into a finite number of Fourier-Bessel coefficients $q_{l,m}(t)$.

For example, the device 100 delivers pressure information p(t) and velocity information $\overline{v}(t)$ at the center 5 of the reproduction unit. In this case, the coefficients $q_{0,0}(t)$ to $q_{1,1}(t)$ representative of the acoustic field are deduced from the signals $c_{0,0}(t)$ to $c_{1,1}(t)$ according to the following relations:

$$q_{0,0}(t) = \frac{1}{\sqrt{4\pi}} c_{0,0}(t) \quad \text{with} \quad c_{0,0}(t) = p(t)$$

$$q_{1,-1}(t) = \rho c \sqrt{\frac{3}{4\pi}}\, c_{1,-1}(t) \quad \text{with} \quad c_{1,-1}(t) = v_Y(t)$$

$$q_{1,0}(t) = -\rho c \sqrt{\frac{3}{4\pi}}\, c_{1,0}(t) \quad \text{with} \quad c_{1,0}(t) = v_Z(t)$$

$$q_{1,1}(t) = -\rho c \sqrt{\frac{3}{4\pi}}\, c_{1,1}(t) \quad \text{with} \quad c_{1,1}(t) = v_X(t)$$

In these equations, $v_x(t)$, $v_y(t)$ and $v_z(t)$ designate the components of the velocity vector $\overline{v}(t)$ in the orthonormal reference frame considered and ρ designates the density of the air.

When these coefficients are defined by the module 91, they are addressed to the response determination module 92.

During a substep 38, the response determination module 92 determines the impulse responses $hp_{l,m}(t)$ which link the Fourier-Bessel coefficients $q_{l,m}(t)$ and the signal emitted $u_n(t)$.

The impulse response delivered by the response determination module 92 is addressed to the parameters determination module 93.

During a substep 39, the module 93 deduces information on elements of the reproduction unit.

In the embodiment described, the parameters determination module 93 determines the distance $r_n$ between the element $\mathbf{3}_n$ and the center 5 with the help of its response $hp_{0,0}(t)$ and of the measurement of the time taken by the sound to propagate from the element $\mathbf{3}_n$ to the acquisition device 100, by virtue of delay estimation procedures with regard to the response $hp_{0,0}(t)$.

In the embodiment described, the acquisition device 100 is able to unambiguously encode the orientation of a source in space. Thus, trigonometric relations between the 3 responses $hp_{1,-1}(t)$, $hp_{1,0}(t)$ and $hp_{1,1}(t)$ involving the coordinates $\theta_n$, and $\phi_n$ are apparent for each instant t.

The module 93 determines the values $hp_{1,-1}$, $hp_{1,0}$ and $hp_{1,1}$ corresponding to the values taken by the responses $hp_{1,-1}(t)$, $hp_{1,0}(t)$ and $hp_{1,1}(t)$ at an arbitrarily chosen instant t such as for example the instant for which $hp_{0,0}(t)$ attains its maximum.

Subsequently, the module 93 estimates coordinates $\theta_n$ and $\phi_n$ with the help of the values $hp_{1,-1}$, $hp_{1,0}$ and $hp_{1,1}$ by means of the following trigonometric relations:

$$\text{-for } hp_{1,0} > 0: \quad \theta_n = \arctan\left(\frac{\sqrt{hp_{1,-1}^2 + hp_{1,1}^2}}{|hp_{1,0}|}\right)$$

$$\text{-for } hp_{1,0} < 0: \quad \theta_n = \pi - \arctan\left(\frac{\sqrt{hp_{1,-1}^2 + hp_{1,1}^2}}{|hp_{1,0}|}\right)$$

$$\text{-for } hp_{1,1} > 0: \quad \phi_n = -\arctan\left(\frac{hp_{1,-1}}{hp_{1,1}}\right)$$

$$\text{-for } hp_{1,1} < 0: \quad \phi_n = \pi - \arctan\left(\frac{hp_{1,-1}}{hp_{1,1}}\right)$$

These relations admit the following particular cases:

$$\text{-for } hp_{1,0} = 0 \text{ and } hp_{1,1} \neq 0: \quad \theta_n = \frac{\pi}{2}$$

$$\text{-for } hp_{1,1} = 0 \text{ and } hp_{1,-1} = 0 \text{ and } hp_{1,0} = 0: \quad \theta_n \text{ and } \phi_n \text{ are undefined}$$

$$\text{-for } hp_{1,1} = 0 \text{ and } hp_{1,-1} \neq 0 \text{ and } hp_{1,0} = 0: \quad \theta_n = \frac{\pi}{2}$$

$$\text{-for } hp_{1,1} = 0 \text{ and } hp_{1,-1} \neq 0 \text{ and } hp_{1,0} \neq 0: \quad \phi_n = -\text{signe}(hp_{1,-1})\frac{\pi}{2}$$

Advantageously, the coordinates $\theta_n$, and $\phi_n$ are estimated over several instants. The final determination of the coordinates $\theta_n$ and $\phi_n$ is obtained by means of techniques of averaging between the various estimates.

As a variant, the coordinates $\theta_n$, and $\phi_n$ are estimated with the help of other responses from among the available $hp_{l,m}(t)$ or are estimated in the frequency domain with the help of the responses $hp_{l,m}(f)$.

Thus defined, the parameters $r_n$, $\theta_n$, and $\phi_n$ are transmitted to the decoder 1 by the definition signal SL.

In the embodiment described, the module 93 also delivers the transfer function $H_n(f)$ of each element $\mathbf{3}_n$, with the help of the responses $hp_{l,m}(t)$ arising from the response determination module 92.

A solution consists in constructing the response $hp'_{0,0}(t)$ corresponding to the selection of the part of the response $hp_{0,0}(t)$ which comprises a non zero signal stripped of its reflections introduced by the listening region 4. The frequency response $H_n(f)$ is deduced by Fourier transform from the response $hp'_{0,0}(t)$ previously windowed. The window may be chosen from the conventional smoothing windows, such as for example rectangular, Hamming, Hanning, and Blackman.

The parameters $H_n(f)$ thus defined are transmitted to the decoder 1 by the supplementary signal RP.

In the embodiment described, the module 93 also delivers the spatio-temporal response $N_{l,m,n}(f)$ of each element $\mathbf{3}_n$ of the reproduction unit 2, deduced by applying a gain adjustment and a temporal alignment of the impulse responses $hp_{l,m}(t)$ with the help of the measurement of the distance $r_n$ of the element $\mathbf{3}_n$ in the following manner:

$$\eta_{l,m,n}(t)=r_n hp_{l,m}(t+r_n/c)$$

The spatio-temporal response $\eta_{l,m,n}(t)$ contains a large amount of information characterizing the element $\mathbf{3}_n$, in particular its position and its frequency response. It is also representative of the directivity of the element $\mathbf{3}_n$, of its spread, and of the room effect resulting from the radiation of the element $\mathbf{3}_n$ in the listening region 4.

The module 93 applies a time windowing to the response $\eta_{l,m,n}(t)$ to adjust the duration for which the room effect is taken into account. The spatio-temporal response expressed in the frequency domain $N_{l,m,n}(f)$ is obtained by Fourier transform of the response $\eta_{l,m,n}(t)$. The spatio-temporal response $N_{l,m,n}(f)$ is then frequency-windowed so as to adjust the frequency band over which the room effect is taken into account. The module 93 then delivers the parameters $N_{l,m,n}(f)$ thus shaped which are provided to the decoder 1 by the supplementary signal RP.

Substeps 32 to 39 are repeated for all the elements $\mathbf{3}_1$ to $\mathbf{3}_N$ of the reproduction unit 2.

As a variant, the calibration means 9 are adapted to receive other types of information pertaining to the element $\mathbf{3}_n$. For example, this information is introduced in the form of a finite number of Fourier-Bessel coefficients representative of the acoustic field produced by the element $\mathbf{3}_n$ in the listening region 4.

Such coefficients may in particular be delivered by means of acoustic simulation implementing a geometrical modeling of the listening region 4 so as to determine the position of the image sources induced by the reflections due to the position of the element $\mathbf{3}_n$ and to the geometry of the listening region 4.

The means of acoustic simulation receive as input the signal $u_n(t)$ emitted by the module 92 and delivered, with the aid of the signal $c_{l,m}(t)$, the Fourier-Bessel coefficients determined by superposition of the acoustic field emitted by the element $\mathbf{3}_n$ and of the acoustic fields emitted by the image sources when the element $\mathbf{3}_n$ receives the signal $u_n(t)$. In this case the decomposition module 91 performs only a transmission of the signal $c_{l,m}(t)$ to the module 92.

As a variant, the calibration means 9 comprise other means of acquisition of information pertaining to the elements $\mathbf{3}_1$ to $\mathbf{3}_N$, such as laser-based position measuring means, signal processing means implementing beam forming techniques or any other appropriate means.

The means 9 implementing the calibration step 30 consist for example of an electronic card or of a computer program or of any other appropriate means.

The details of the parameters simulation step 40 and the means 8 which implement it will now be described. This step is carried out for each frequency f of operation.

The embodiments described require the knowledge for each element $\mathbf{3}_n$ of its complete position described by the parameters $r_n$, $\theta_n$, $\phi_n$ and/or of its spatio-temporal response described by the parameters $N_{l,m,n}(f)$.

Figure 6:
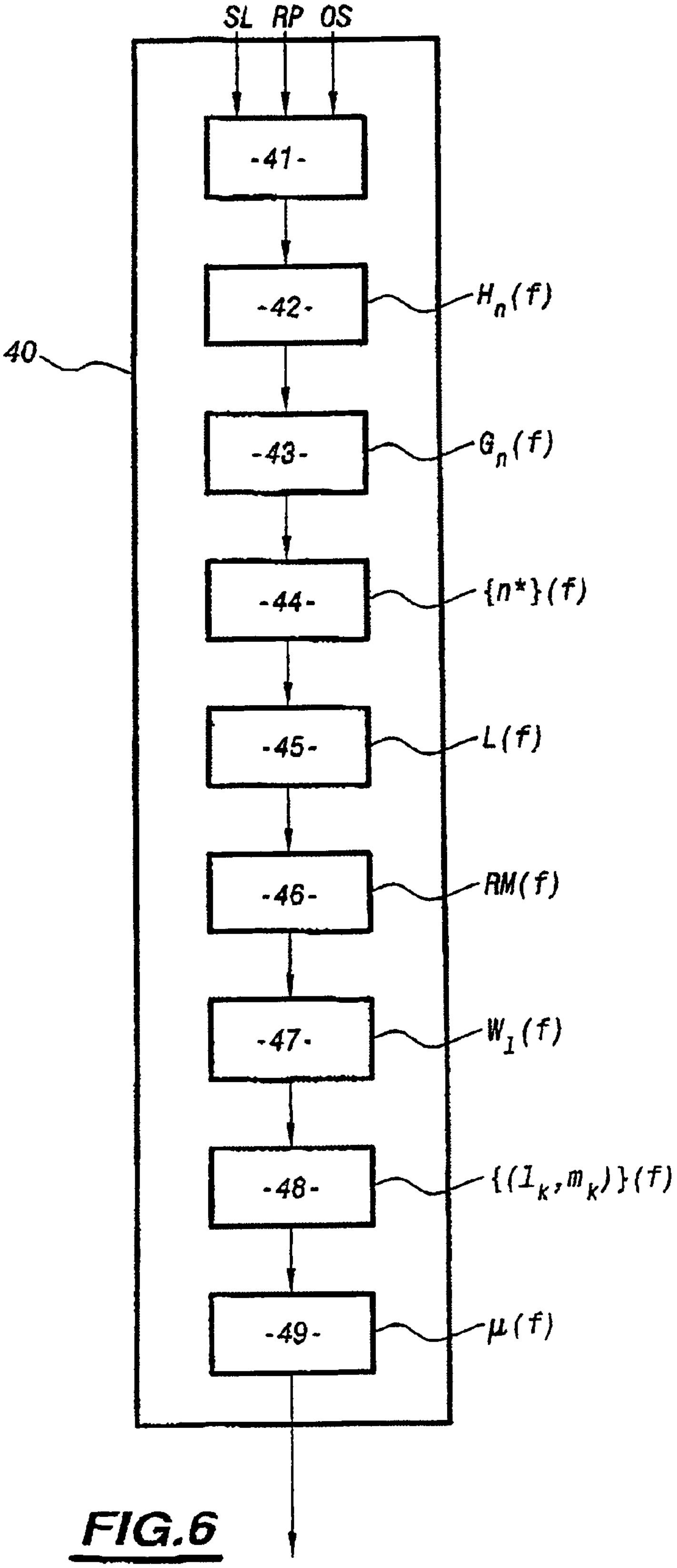
FIG. 6 is a diagram of the simulation step.

In a first embodiment, described with reference to FIG. 6, the parameters which are neither input, by an operator or by external means, nor measured, are simulated.

Step 40 begins with a substep 41 of determining parameters missing from the signals RP, SL and OS received.

During a substep 42, the parameter $H_n(f)$ representative of the response of the elements of the reproduction unit 2 takes the default value 1.

During a substep 43, the parameter $G_n(f)$ representative of the templates of the elements of the reproduction unit 2 is determined by thresholding on the parameter $H_n(f)$ in the case where the latter is measured, defined by the user, or provided by external means, otherwise, $G_n(f)$ takes the default value 1.

Step 40 then comprises a substep 44 of determining the active elements at the frequency f considered.

During this substep, a list $\{n^*\}(f)$ of elements of the reproduction unit that are active at the frequency f is determined, these elements being those whose template $G_n(f)$ is non zero for this frequency. The list $\{n^*\}(f)$ comprises $N_f$ elements and it is transmitted to the decoder 1 by the optimization signal OS. It is used to select the parameters corresponding to the active elements at each frequency f among the set of parameters. The parameters of index n* correspond to the $n^{th}$ active element at the frequency f.

During a substep 45, the parameter L(f) representative of the order of operation of the module for determining the filters at the current frequency f, is determined in the following manner:

the simulation means 8 calculate the smallest angle $a_{min}$ formed by a pair of elements of the reproduction unit by means of a trigonometric relation, such as for example:

$$a_{n1^*,n2^*}=a\cos(\sin\theta_{n1^*}\sin\theta_{n2^*}\cos(\phi_{n1^*}-\phi_{n2^*})+\cos\theta_{n1^*}\cos\theta_{n2^*})$$

$$a_{min}=\min(a_{n1^*,n2^*})$$

among the set of pairs (n1*, n2*) such that n1*≠n2*;

the simulation means 9 determine the maximum order L(f) which is the largest integer obeying the relation $$L(f)<\pi/a_{min}.$$

During a substep 46, the parameter RM(f) defining the radiation model for the elements constituting the reproduction unit, is determined automatically taking the spherical radiation model as default.

During a substep 47, the parameter $W_l(f)$ which describes the spatial window representative of the distribution in space of constraints of reconstruction of the acoustic field in the form of weighting of Fourier-Bessel coefficients is determined in the following manner:

if the parameter W(r,f) representative of the spatial window in the spherical reference frame is provided or input, $W_l(f)$ is deduced from its value by applying the expression:

$$W_l(f)=16\pi^2\int_0^\infty W(r,f)j_l^2(kr)r^2\,dr$$

and if the parameter R(f), which represents a radius when the spatial window is a ball of radius R(f), is provided by external means or input, $W_l(f)$ is deduced from its value by applying the expression:

$$W_l(f) = 8\pi^2 R^3(f)\left(j_l^2(kR(f)) + j_{l+1}^2(kR(f)) - \frac{2l+1}{kR(f)} j_l(kR(f)) j_{l+1}(kR(f))\right)$$

otherwise, $W_l(f)$ is deduced from L(f), by applying the expression:

$$W_l(f) = 8\pi^2 R^3\left(j_l^2(kR) + j_{l+1}^2(kR) - \frac{2l+1}{kR} j_l(kR) j_{l+1}(kR)\right) \text{ with } R = \frac{L(f)c}{2\pi f}$$

As a variant, if the spatial window is not specified, the simulation means 8 allocate the parameter $W_l(f)$ a default value, for example a Hamming window of size 2L(f)+1, evaluated in l.

The parameter $W_l(f)$ is determined for the values of l ranging from 0 to L(f).

During a substep 48, the parameter $\{(l_k, m_k)\}(f)$ is deduced from the parameters L(f) and $\bar{x}_{n^*}$, in the following manner:

Firstly, the means 9 calculate the coefficients $$G_{l,m,n^*} = y_l^m(\theta_{n^*}, \phi_{n^*})$$

where $(\theta_{n^*}, \phi_{n^*})$ is the direction of the reproduction element $\mathbf{3}_{n^*}$.

Secondly, the means 9 calculate the coefficients $$G_{l,m} = \sqrt{\sum_{n=l}^{N_f} G_{l,m,n^*}^2}$$

Thirdly, the means 8 calculate, with the aid of a supplementary parameter $\epsilon$, the list of parameters $\{(l_k, m_k)\}(f)$, referred to as C and which is initially empty. For each value of the order l, starting at 0, the means 8 carry out the following substeps:

search for $G_l = \max(G_{l,m})$;

determination of the list $C_l$ of coefficients (l,m) such that $G_{l,m}$ (in dB) lies between $G_l - \epsilon$ (in dB) and $G_l$ (in dB).

If the sum of the number of terms in C and of the number of terms in $C_l$ is greater than or equal to the number $N_f$ of active reproduction elements at the frequency f, the list C is complete, otherwise, $C_l$ is added to C and the search for $G_l$ is restarted for l+1.

In the case where the elements $\mathbf{3}_{l^*}$ to $\mathbf{3}_{N_f^*}$ are in a horizontal plane and where the list of the $\{(lk, m_k)\}(f)$ is neither input, nor provided, the simulation means 8 perform a simplified processing:

The list of coefficients $\{(l_k, m_k)\}(f)$ takes the form: $\{(0,0),(1,-1),(1,1),(2,-2),(2,2) \ldots (L_l,-L_l),(L_l,L_l)\}$ where $L_l$ is chosen so that the number of elements in this list is less than the number $N_f$ of elements $\mathbf{3}_{n^*}$ active at the frequency f. The value taken by $L_l$ may be the integer part of $(N_f-1)/2$, but it is preferable to take a smaller value for $L_l$.

During a substep 49, the parameter μ(f), which represents at the current frequency f the desired local capacity of adaptation, varying between 0 and 1, is determined automatically, taking the default value 0.7 for example.

Thus, the simulation means 9 make it possible, during step 40, to supplement the signals SL, RP and OS in such a way as to deliver to the means 12 for determining reconstruction filters the set of parameters necessary for their implementation.

As a function of the parameters input or measured, some of the simulation substeps described are not carried out.

The simulation step 40 consisting of the set of substeps 41 to 49, is repeated for all the frequencies considered. As a variant, each substep is carried out for all the frequencies before going to the next substep.

In another embodiment, all the parameters involved are provided to the decoder 1 and step 40 then comprises only the substep 41 of receiving and verifying the signals SL, RP and OS and the substep 44 of determining the active elements at the frequency f considered.

The simulation means 8 implementing step 40 are for example computer programs or electronic cards dedicated to such an application or any other appropriate means.

Step 50 of determining reconstruction filters and the means 12 which implement it will now be described in greater detail.

Figure 7:
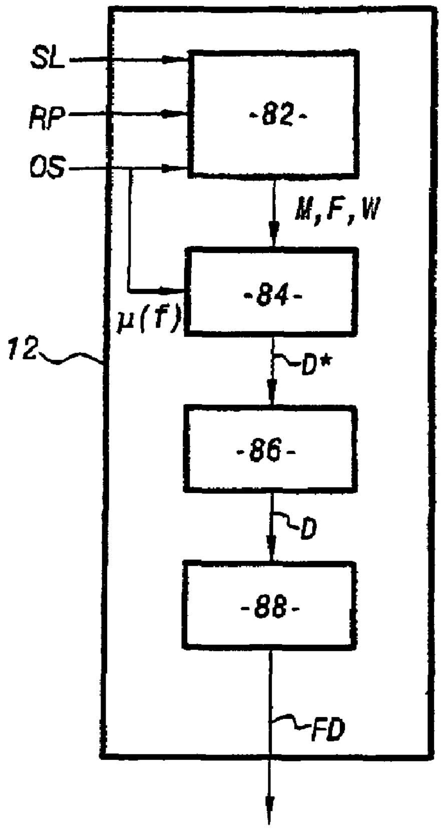
FIG. 7 is a diagram of the means of determining reconstruction filters.

Represented in FIG. 7 are the means 12 of determining reconstruction filters which comprise a module 82 for determining transfer matrices with the help of the parameters of the signals SL, RP and OS as well as the means 84 for determining a decoding matrix D*.

The means 12 also comprise a module 86 for storing the response of the reconstruction filters and a module 88 for parameterizing reconstruction filters.

Figure 8:
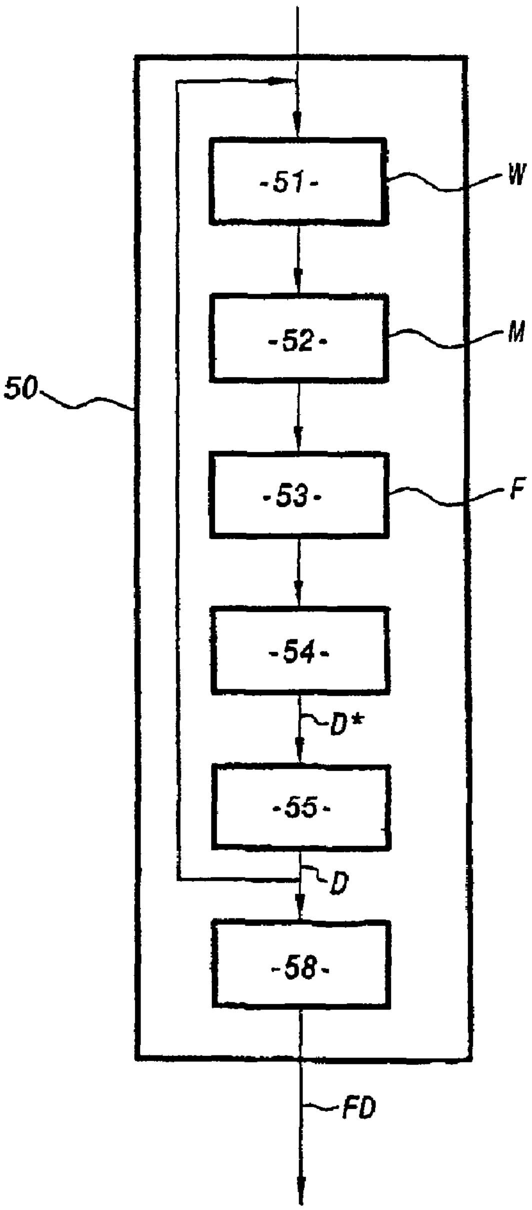
FIG. 8 is a diagram of the step of determining reconstruction filters.

Represented in FIG. 8 are the details of step 50 for determining reconstruction filters.

Step 50 is repeated for each frequency of operation and comprises a plurality of substeps for determining matrices representative of the parameters defined previously.

Step 50 of determining reconstruction filters comprises a substep 51 of determining a matrix W for weighting the acoustic field with the help of the signals L(f) and $W_l(f)$.

W is a diagonal matrix of size $(L(f)+1)^2$ containing the weighting coefficients $W_l(f)$ and in which each coefficient $W_l(f)$ is found 2l+1 times in succession on the diagonal. The matrix W therefore has the following form:

$$W = \begin{bmatrix} W_0(f) & 0 & \cdots & \cdots & \cdots & \cdots & \cdots & 0 \\ 0 & W_1(f) & \ddots & & & & & \vdots \\ \vdots & \ddots & W_1(f) & \ddots & & & & \vdots \\ \vdots & & \ddots & W_1(f) & \ddots & & & \vdots \\ \vdots & & & \ddots & \ddots & \ddots & & \vdots \\ \vdots & & & & \ddots & W_L(f) & \ddots & \vdots \\ \vdots & & & & & \ddots & \ddots & 0 \\ 0 & \cdots & \cdots & \cdots & \cdots & \cdots & 0 & W_L(f) \end{bmatrix}$$

Likewise, step 50 comprises a substep 52 of determining a matrix M representative of the radiation of the reproduction unit with the help of the parameters $N_{l,m,n^*}(f)$, RM(f), $H_{n^*}(f)$, $\bar{x}_{n^*}$, and L(f).

M is a matrix of size $(L(f)+1)^2$ by $N_f$, consisting of elements $M_{l,m,n^*}$, the indices l,m designating row $l^2$+l+m and n* designating column n. The matrix M therefore has the following form:

$$\begin{bmatrix} M_{0,0,1^*} & M_{0,0,2^*} & \cdots & M_{0,0,N_f^*} \\ M_{1,-1,1^*} & M_{1,-1,2^*} & \cdots & M_{1,-1,N_f^*} \\ M_{1,0,1^*} & M_{1,0,2^*} & \cdots & M_{1,0,N_f^*} \\ M_{1,1,1^*} & M_{1,1,2^*} & \cdots & M_{1,1,N_f^*} \\ \vdots & \vdots & & \vdots \\ M_{L,-L,1^*} & M_{L,-L,2^*} & \cdots & M_{L,-L,N_f^*} \\ \vdots & \vdots & & \vdots \\ M_{L,0,1^*} & M_{L,0,2^*} & \cdots & M_{L,0,N_f^*} \\ \vdots & \vdots & & \vdots \\ M_{L,L,1^*} & M_{L,L,2^*} & \cdots & M_{L,L,N_f^*} \end{bmatrix}$$

The elements $M_{l,m,n^*}$ are obtained as a function of the radiation model RM(f):

if RM(f) defines a plane wave radiation model $$M_{l,m,n^*}=y_l^m(\theta_{n^*},\phi_{n^*})H_{n^*}(f)$$

if RM(f) defines a spherical wave radiation model $$M_{l,m,n^*}=y_l^m(\theta_{n^*},\phi_{n^*})H_{n^*}(f)\xi_l(r_{n^*},f)$$

if RM(f) defines a model using the measurements performed of the spatio-temporal responses, with recourse to the plane wave model for the missing measurements, then $M_{l,m,n^*}=N_{l,m,n^*}(f)$ for the indices l,m,n* provided and the current frequency f. The remainder of the $M_{l,m,n^*}$ is determined according to the relation:

$$M_{l,m,n^*}=y_l^m(\theta_{n^*},\phi_{n^*})H_{n^*}(f)$$

if RM(f) defines a model using the measurements performed of the spatio-temporal responses, with recourse to the spherical wave model for the missing measurements, then $M_{l,m,n^*}=N_{l,m,n^*}(f)$ for the indices l,m,n* provided and the current frequency f. The remainder of the $M_{l,m,n^*}$ is determined according to the relation:

$$M_{l,m,n^*}=y_l^m(\theta_{n^*},\phi_{n^*})H_{n^*}(f)\xi_l(r_{n^*},f)$$

In these expressions $\xi_l(r_{n^*},f)$ is defined by the expression:

$$\xi_l(r_{n^*},f)=\sum_{k=0}^{l}\frac{(l+k)!}{2^k k!(l-k)!}\left(\frac{j2\pi r_{n^*}f}{c}\right)^{-k}$$

The elements $D^*_{n,l,m}$ of the matrix D* are organized in the following manner:

$$\begin{bmatrix} D^*_{1,0,0} & D^*_{1,1,-1} & D^*_{1,1,0} & D^*_{1,1,1} & \cdots & D^*_{1,L,-L} & \cdots & D^*_{1,L,0} & \cdots & D^*_{1,L,L} \\ D^*_{2,0,0} & D^*_{2,1,-1} & D^*_{2,1,0} & D^*_{2,1,1} & \cdots & D^*_{2,L,-L} & \cdots & D^*_{2,L,0} & \cdots & D^*_{2,L,L} \\ \vdots & \vdots & \vdots & \vdots & & \vdots & & \vdots & & \vdots \\ D^*_{N_f,0,0} & D^*_{N_f,1,-1} & D^*_{N_f,1,0} & D^*_{N_f,1,1} & \cdots & D^*_{N_f,L,-L} & \cdots & D^*_{N_f,L,0} & \cdots & D^*_{N_f,L,L} \end{bmatrix}$$

The matrix M thus defined is representative of the radiation of the reproduction unit. In particular, M is representative of the spatial configuration of the reproduction unit.

When the method uses the coefficients $N_{l,m,n}(f)$, the matrix M is representative of the spatio-temporal responses of the elements 3$_1$ to 3$_N$ and therefore in particular of the room effect induced by the listening region 4.

Step 50 also comprises a substep 53 of determining a matrix F representative of the Fourier-Bessel functions, perfect reconstruction of which is demanded. This matrix is determined with the help of the parameter L(f), as well as the parameters $\{(l_k,m_k)\}(f)$ in the following manner.

With the help of the list $\{(l_k,m_k)\}(f)$, calling K the number of elements $(l_k,m_k)$ of the list $\{(l_k,m_k)\}(f)$, the matrix F constructed is of size K by $(L(f)+1)^2$. Each row k of the matrix F contains a 1 in column $l_k^2+l_k+m_k$, and 0s elsewhere. For example, for a configuration of the reproduction unit of so-called "5.1" type, whose list $\{(l_k,m_k)\}(f)$ can take the form $\{(0,0), (1,-1), (1,1)\}$, the matrix F may be written:

$$F=\begin{bmatrix} 1 & 0 & 0 & 0 & 0 & 0 & 0 & 0 & \ldots & 0 \\ 0 & 1 & 0 & 0 & 0 & 0 & 0 & 0 & \ldots & 0 \\ 0 & 0 & 0 & 1 & 0 & 0 & 0 & 0 & \ldots & 0 \end{bmatrix}$$

When the parameter $\mu(f)$ is zero, the decoder 1 reproduces only the Fourier-Bessel functions enumerated by the parameters $\{(l_k,m_k)\}(f)$, the others being ignored. When $\mu(f)$ is set to 1, the decoder reproduces perfectly the Fourier-Bessel functions designated by $\{(l_k,m_k)\}(f)$ but reproduces moreover partially numerous other Fourier-Bessel functions among those available up to order L(f) so that globally the reconstructed field is closer to that described as input. This partial reconstruction allows the decoder 1 to accommodate reproduction configurations that are very irregular in their angular distribution.

Substeps 51 to 53 implemented by the module 82 can be executed sequentially or simultaneously.

Step 50 of determining reconstruction filters thereafter comprises a substep 54 of taking into account the set of parameters determined previously, implemented by the module 84 so as to deliver a decoding matrix D* representative of the reconstruction filters.

This matrix D* is delivered with the help of the matrices M, F, W and of the parameter $\mu(f)$ according to the following expression:

$$D^*=\mu AM^TW+AM^TF^T(FMAM^TF^T)^{-1}F(I_{(L+1)^2}-\mu MAM^TW)$$

with $A=((1-\mu)\ I_N+\mu M^TWM)^{-1}$ where $M^T$ designates the matrix which is the conjugate transpose of M.

The matrix D* is therefore representative of the configuration of the reproduction unit, of the acoustic characteristics associated with the elements 3$_1$ to 3$_N$ and of the optimization strategies.

In the case where the method uses the coefficients $N_{l,m,n}(f)$, the matrix D* is representative in particular of the room effect induced by the listening region 4.

Subsequently, during a substep 55, the module 86 for storing the response of the reconstruction filters at the current frequency f supplements for the frequency f the matrix D(f) representative of the frequency response of the reconstruction filters, by receiving the matrix D* as input. The elements of the matrix D* are stored in the matrix D(f), by inverting the method, described previously with reference to FIG. 6, for determining the list {n*}(f). More precisely, each element $D^*_{n,l,m}$ of the matrix D* is stored in the element $D_{n^*,l,m}(f)$ of the matrix D(f). The elements of D(f) that are not determined on completion of this substep are fixed at zero.

Such a use of the list {n*}(f) makes it possible to take account of heterogeneous templates of the reproduction elements $\mathbf{3}_1$ to $\mathbf{3}_N$.

The elements $D_{n,l,m}(f)$ of the matrix D(f) are organized in the following manner:

$$\begin{bmatrix} D_{1,0,0}(f) & D_{1,1,-1}(f) & D_{1,1,0}(f) & D_{1,1,1}(f) & \cdots & D_{1,L,-L}(f) & \cdots & D_{1,L,0}(f) & \cdots & D_{1,L,L}(f) \\ D_{2,0,0}(f) & D_{2,1,-1}(f) & D_{2,1,0}(f) & D_{2,1,1}(f) & \cdots & D_{2,L,-L}(f) & \cdots & D_{2,L,0}(f) & \cdots & D_{2,L,L}(f) \\ \vdots & \vdots & \vdots & \vdots & & \vdots & & \vdots & & \vdots \\ D_{N,0,0}(f) & D_{N,1,-1}(f) & D_{N,1,0}(f) & D_{N,1,1}(f) & \cdots & D_{N,L,-L}(f) & \cdots & D_{N,L,0}(f) & \cdots & D_{N,L,L}(f) \end{bmatrix}$$

The set of substeps 51 to 55 is repeated for all the frequencies f considered and the results are stored in the storage module 86. On completion of this processing, the matrix D(f) representative of the frequency responses of the set of reconstruction filters is addressed to the module 88 for parameterizing reconstruction filters.

During a substep 58, the reconstruction filters parameterization module 88 then provides the signal FD representative of the reconstruction filters, by receiving the matrix D(f) as input. Each element $D_{n,l,m}(f)$ of the matrix D(f) is a reconstruction filter which is described in the signal FD by means of parameters which may take various forms.

For example, the parameters of the signal FD that are associated with each filter $D_{n,l,m}(f)$ may take the following forms:

- a frequency response, whose parameters are directly the values of $D_{n,l,m}(f)$ for certain frequencies f:
- a finite impulse response, whose parameters $d_{n,l,m}(t)$ are calculated by inverse temporal Fourier transform of $D_{n,l,m}(f)$. Each impulse response $d_{n,l,m}(t)$ is sampled and then truncated to a length particular to each response; or
- coefficients of an infinite impulse response recursive filter calculated with the help of the $D_{n,l,m}(f)$ with conventional adaptation procedures.

Thus, on completion of step 50 the means 12 for determining reconstruction filters deliver a signal FD to the means 11 for determining control signals.

In this embodiment, this signal FD is representative of the following parameters:

- spatial configuration of the elements of the reproduction unit;
- acoustic characteristics associated with the elements of the reproduction unit, in particular the frequency responses and the spatio-temporal responses representative, among other things, of the room effect induced by the listening region 4;
- optimization strategies, in particular the spatio-temporal functions upon which one imposes the reconstruction, the distribution in space of constraints of reconstruction of the acoustic field and the desired local capacity of adaptation to the spatial irregularity of the configuration of the reproduction unit 2.

The means 12 for determining reconstruction filters may be embodied in the form of software dedicated to this function or else be integrated into an electronic card or any other appropriate means.

Step 60 of shaping the input signal will now be described in greater detail.

When the system is implemented, it receives the input signal SI which comprises temporal and spatial information of a sound environment to be reproduced. This information may be of several sorts, in particular:

- a sound environment coded according to an angular distribution such as for example the format commonly dubbed “B format”;
- a description of a sound environment by means of position information for virtual sources which make up the sound environment and signals emitted by these sources;
- a sound environment coded in multichannel mode, that is to say by means of signals intended to power loudspeakers whose angular distribution is fixed and known and which includes in particular the so-called “7.1”, “5.1” quadriphonic, stereophonic and monophonic techniques;
- a sound environment given by its acoustic field in the form of Fourier-Bessel coefficients.

As was stated with reference to FIG. 3, during step 60, the shaping means 6 receive the input signal SI and decompose it into Fourier-Bessel coefficients representative of an acoustic field corresponding to the sound environment described by the signal SI. These Fourier-Bessel coefficients are delivered to the decoder 1 by the signal $SI_{FB}$.

As a function of the sort of input signal SI, the shaping step 60 varies.

Figure 9:
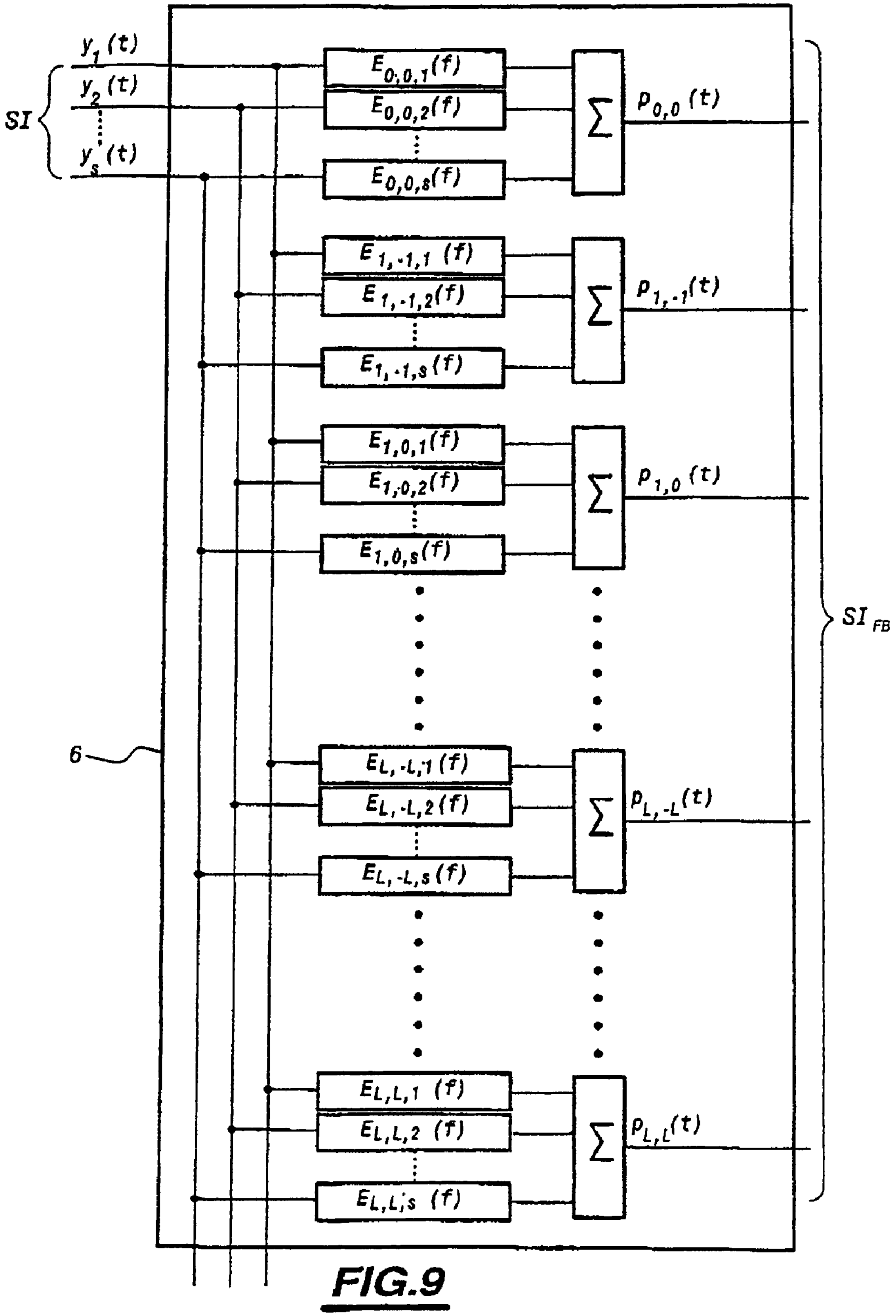
FIG. 9 is a mode of embodiment of the step of shaping the input signal.

With reference to FIG. 9, the decomposition into Fourier-Bessel coefficients will now be described in the case where the sound environment is coded in the signal SI in the form of the description of a sound scene by means of position information for the virtual sources of which it is composed and of the signals emitted by these sources.

A matrix E makes it possible to allocate a radiation model, for example a spherical wave model, to each virtual source s. E is a matrix of size $(L+1)^2$ by S, where S is the number of sources present in the scene and L is the order to which the decomposition is conducted. The position of a source s is designated by its spherical coordinates $r_s$, $\theta_s$ and $\phi_s$. The elements $E_{l,m,s}$ of the matrix E may be written in the following manner:

$$E_{l,m,s}(f) = \frac{1}{r_s} e^{-2\pi j r_s f/c} y_l^m(\theta_s, \phi_s) \xi_l(r_s, f)$$

Also introduced is the vector Y which contains the temporal Fourier transforms $Y_s(f)$ of the signals $y_s(t)$ emitted by the sources. Y may be written:

$$Y = [Y_1(f) Y_2(f) \ldots Y_s(f)]^t$$

The Fourier-Bessel coefficients $P_{l,m}(f)$ are placed in a vector P of size $(L+1)^2$, where the 2l+1 terms of order l are placed one after another in ascending order l. The coefficient $P_{l,m}(f)$ is thus the element of index $l^2+l+m$ of the vector P which may be written:

$$P=EY$$

As represented with reference to FIG. 9, the obtaining of the Fourier-Bessel coefficients $P_{l,m}(f)$, constituting the signal $SI_{FB}$, corresponds to a filtering of each signal $Y_s(f)$ by means of the filter $E_{l,m,s}(f)$, then by summing the results. The coefficients $P_{l,m}(f)$ are therefore expressed in the following manner:

$$P_{l,m}(f)=\sum_{s=1}^{S} Y_s(f)E_{l,m,s}(f)$$

Deployment of the filters $E_{l,m,s}(f)$ may be effected according to conventional filtering procedures, such as for example:

- filtering in the frequency domain;
- filtering with the aid of a finite impulse response filter; or
- filtering with the aid of an infinite impulse response filter. It is a matter of the most direct procedure which consists in deducing a recursive filter from the expression $E_{l,m,s}(f)$, for example with the aid of a bilinear transform.

In the case where the signal SI corresponds to the representation of a sound environment according to a multichannel format, the shaping means 6 perform the operations described hereinafter.

A matrix S makes it possible to allocate to each channel c a radiation source, for example a plane wave source whose direction of origination $(\theta_c, \phi_c)$ corresponds to the direction of the reproduction element associated with the channel c in the multichannel format considered. S is a matrix of size $(L+1)^2$ by C, where C is the number of channels. The elements $S_{l,m,c}$ of the matrix S may be written:

$$S_{l,m,c}=y_l^m(\theta_c,\phi_c)$$

Also defined is the vector Y which contains the signals $y_c(t)$ corresponding to each channel. Y may be written:

$$Y=[y_1(t)\, y_2(t) \ldots y_c(t)]^t$$

The Fourier-Bessel coefficients $p_{l,m}(t)$ grouped together as previously in the vector P are obtained through the relation:

$$P=SY$$

Each Fourier-Bessel coefficient $p_{l,m}(t)$ constituting the signal $SI_{FB}$ is obtained by linear combination of the signals $y_c(t)$:

$$p_{l,m}(t)=\sum_{c=1}^{C} y_c(t)S_{l,m,c}$$

In the case where the signal SI corresponds to the angular description of a sound environment according to the B format, the four signals W(t), X(t), Y(t) and Z(t) of this format decompose by applying simple gains:

$$p_{0,0}(t)=\frac{1}{\sqrt{4\pi}}W(t)$$

-continued $$p_{1,1}(t)=\sqrt{\frac{3}{8\pi}}X(t)$$

$$p_{1,-1}(t)=-\sqrt{\frac{3}{8\pi}}Y(t)$$

$$p_{1,0}(t)=\sqrt{\frac{3}{8\pi}}Z(t)$$

Finally, in the case where the signal SI corresponds to a description of the acoustic field in the form of the Fourier-Bessel coefficients, step 60 consists simply of signal transmission.

Thus, on completion of the shaping step 60, the means 6 deliver, destined for the means 11 for determining control signals, a signal $SI_{FB}$ corresponding to the decomposition of the acoustic field to be reproduced into a finite number of Fourier-Bessel coefficients.

The means 6 may be embodied in the form of dedicated computer software or else be embodied in the form of a dedicated computing card or any other appropriate means.

The step 70 of determining control signals will now be described in greater detail.

The means 11 for determining control signals receive as input the signal $SI_{FB}$ corresponding to the Fourier-Bessel coefficients representative of the acoustic field to be reproduced and the signal FD representative of the reconstruction filters arising from the means 12. As stated previously, the signal FD integrates parameters characteristic of the reproduction unit 2.

With the help of this information, during step 70, the means 11 determine the signals $sc_1(t)$ to $sc_N(t)$ delivered destined for the elements $\mathbf{3}_1$ to $\mathbf{3}_N$. These signals are obtained by the application to the signal $SI_{FB}$ of the reconstruction filters, of frequency response $D_{n,l,m}(f)$, and transmitted in the signal FD.

The reconstruction filters are applied in the following manner:

$$V_n(f)=\sum_{l=0}^{L}\sum_{m=-l}^{l} P_{l,m}(f)D_{n,l,m}(f)$$

with $P_{l,m}(f)$ the Fourier-Bessel coefficients constituting the signal $SI_{FB}$ and $V_n(f)$ defined by:

$$V_n(f)=\frac{SC_n(f)}{r_n}e^{-2\pi j r_n f/c}$$

where $SC_n(f)$ is the temporal Fourier transform of $sc_n(t)$.

According to the form of the parameters of the signal FD, each filtering of the $P_{l,m}(f)$ by $D_{n,l,m}(f)$ can be carried out according to conventional filtering procedures, such as for example:

- the signal FD provides the frequency responses $D_{n,l,m}(f)$ directly, and the filtering is performed in the frequency domain, for example, with the aid of the usual block convolution techniques;
- the signal FD provides the finite impulse responses $d_{n,l,m}(t)$, and the filtering is performed in the time domain by convolution; or the signal FD provides the coefficients of infinite impulse response recursive filters, and the filtering is performed in the time domain by means of recurrence relations.

Figure 10:
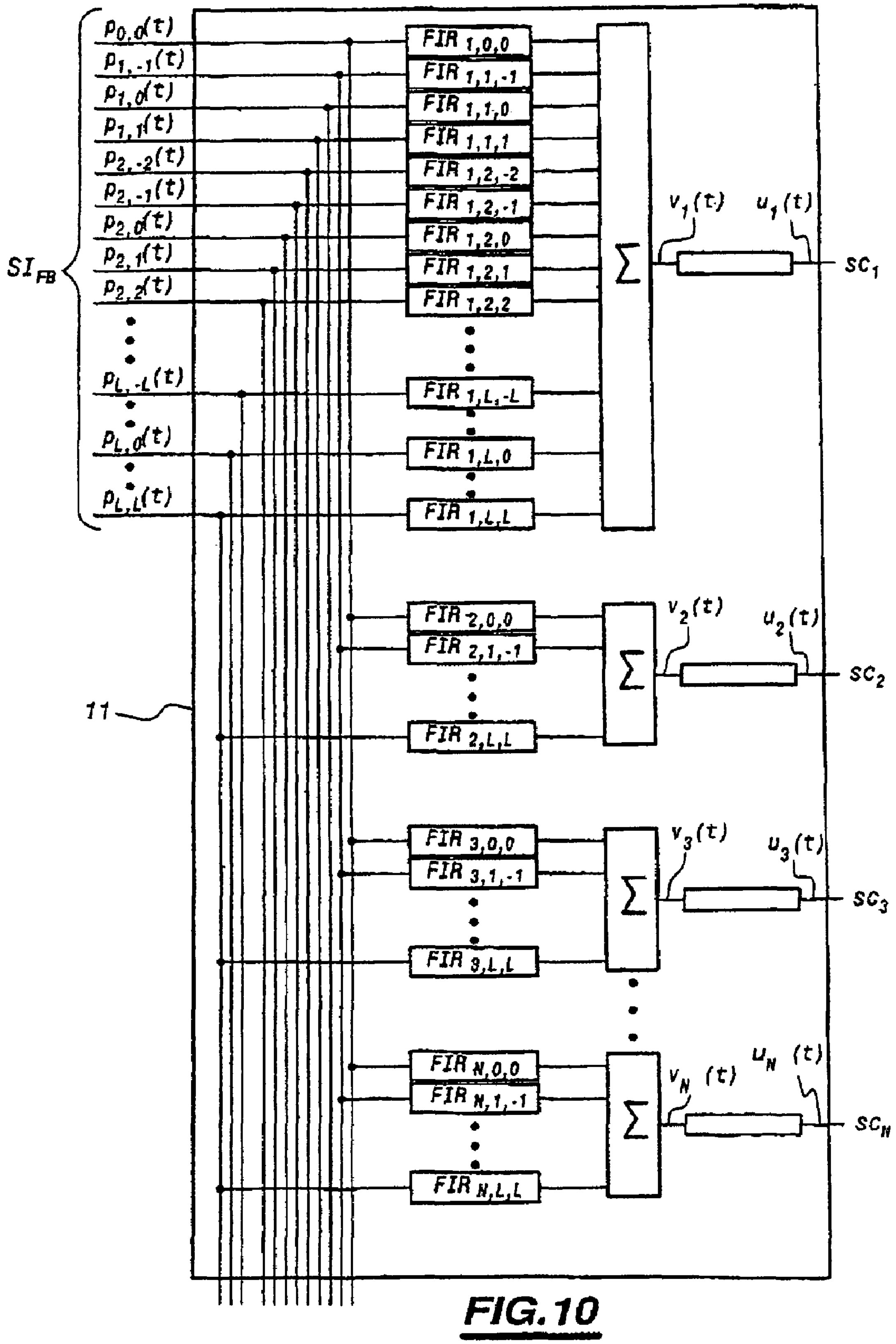
FIG. 10 is a mode of embodiment of the step of determining control signals.

Represented in FIG. 10 is the case of the finite impulse response filter.

The number of samples individual to each response $d_{n,l,m}(t)$ is defined $T_{n,l,m}$, this leading to the following convolution expression:

$$v_n[t] = \sum_{l=0}^{L} \sum_{m=-l}^{l} \sum_{\tau=0}^{T_{n,l,m}-1} d_{n,l,m}[\tau] p_{l,m}[t-\tau]$$

Step 70 terminates with an adjustment of the gains and the application of delays so as to temporally align the wavefronts of the elements $\mathbf{3}_1$ to $\mathbf{3}_N$ of the reproduction unit 2 with respect to the element furthest away. The signals $sc_1(t)$ to $sc_N(t)$ intended to feed the elements $\mathbf{3}_1$ to $\mathbf{3}_N$ are deduced from the signals $v_1(t)$ to $v_N(t)$ according to the expression:

$$sc_n(t) = r_n \, v_n\left(t - \frac{\max(r_n) - r_n}{c}\right)$$

Each element $\mathbf{3}_1$ to $\mathbf{3}_N$ therefore receives a specific control signal $sc_1$ to $sc_N$ and emits an acoustic field which contributes to the optimal reconstruction of the acoustic field to be reproduced. The simultaneous control of the whole set of elements $\mathbf{3}_1$ to $\mathbf{3}_N$ allows optimal reconstruction of the acoustic field to be reproduced.

Furthermore, the system described can also operate in simplified modes.

For example, in a first simplified embodiment, during step 50, the module 12 for determining filters receives only the following parameters:

- $\bar{x}_n$ representative of the position of the element $\mathbf{3}_n$ of the reproduction unit 2;
- $W_l$ describing, directly in the form of weighting of the Fourier-Bessel coefficients, a spatial window representative of the distribution in space of constraints of reconstruction of the acoustic field; and
- L, imposing the limit order of operation of the means 12 for determining reconstruction filters.

In this simplified mode, these parameters are independent of the frequency and the elements $\mathbf{3}_1$ to $\mathbf{3}_N$ of the reproduction unit are active and assumed to be ideal for all the frequencies. The substeps of step 50 are therefore carried out once only. During substep 52, the matrix M is constructed with the help of a plane wave radiation model. The elements $M_{l,m,n}$ of the matrix M simplify into:

$$M_{l,m,n} = y_l^m(\theta_n, \phi_n)$$

In this simplified mode, $\mu=1$ and the list $\{(l_k, m_k)\}(f)$ contains no terms. During substep 54, the module 84 then determines the matrix D directly according to the simplified expression:

$$D = (M^T W M)^{-1} M^T W$$

The storage of the response of the reconstruction filters is no longer necessary, and substep 55 is not carried out. Likewise, the filters described in the matrix D having simple gains, substep 58 is no longer carried out and the module 84 provides the signal FD directly.

During step 70, the determination of the drive signals is performed in the time domain and corresponds to simple linear combinations of the coefficients $p_{l,m}(t)$, followed by a temporal alignment according to the expression:

$$sc_n(t) = r_n \, v_n\left(t - \frac{\max(r_n) - r_n}{c}\right) \text{ with}$$

$$v_n(t) = \sum_{l=0}^{L} \sum_{m=-l}^{l} p_{l,m}(t) D_{n,l,m}$$

The module 11 then provides the drive signals $sc_1(t)$ to $sc_N(t)$ intended for the reproduction unit.

In another simplified embodiment, during step 50, the module 12 for determining filters receives the following parameters as input:

- $x_n$, representative of the position of the element $\mathbf{3}_n$ of the reproduction unit 2;
- $\{(l_k, m_k)\}$, constituting the list of spatio-temporal functions whose reconstruction is imposed; and
- L, imposing the order of operation of the means 12 for determining reconstruction filters.

In this simplified mode, the parameters are independent of the frequency and the elements $\mathbf{3}_1$ to $\mathbf{3}_N$ of the reproduction unit are active and assumed to be ideal for all the frequencies. The substeps of step 50 are therefore carried out once only. During substep 52, the matrix M is constructed with the help of a plane wave radiation model. The elements $M_{l,m,n}$ of the matrix M simplify into:

$$M_{l,m,n} = y_l^m(\theta_n, \phi_n)$$

Substep 53 of determining the matrix F remains unchanged. In this simplified mode $\mu=0$ and during substep 54, the module 84 determines the matrix D directly according to the simplified expression:

$$D = M^T F^T (F M M^T F^T)^{-1} F$$

The storage of the response of the reconstruction filters is no longer necessary, and substep 55 is not carried out. Likewise, the filters described in the matrix D having simple gains, substep 58 is no longer carried out and the module 84 provides the signal FD directly.

During step 70, the determination of the drive signals is performed in the time domain and corresponds to simple linear combinations of the coefficients $p_{l,m}(t)$, followed by a temporal alignment according to the expression:

$$sc_n(t) = r_n \, v_n\left(t - \frac{\max(r_n) - r_n}{c}\right) \text{ with}$$

$$v_n(t) = \sum_{l=0}^{L} \sum_{m=-l}^{l} p_{l,m}(t) D_{n,l,m}$$

The module 11 then provides the drive signals $sc_1(t)$ to $sc_N(t)$ intended for the reproduction unit.

It is apparent that according to the invention, the control signals $sc_1$ to $sc_N$ are adapted to best utilize the spatial characteristics of the reproduction unit 2, the acoustic characteristics associated with the elements $\mathbf{3}_1$ to $\mathbf{3}_N$ and the optimization strategies in such a way as to reconstruct a high-quality acoustic field.

It is therefore apparent that the method implemented makes it possible in particular to obtain optimum reproduction of a three-dimensional acoustic field regardless of the spatial configuration of the reproduction unit 2.

The invention is not limited to the embodiments described.

In particular, the method of the invention can be implemented by digital computers such as one or more computer processors or digital signal processors (DSP).

It may also be implemented with the help of a general platform such as a personal computer.

It is also possible to devise an electronic card intended to be inserted into another element and adapted for storing and executing the method of the invention. For example, such an electronic card is integrated into a computer.

In other embodiments, all or part of the parameters necessary for the execution of the step of determining reconstruction filters is extracted from prerecorded memories or is delivered by another apparatus dedicated to this function.

The invention claimed is:

1. A method of controlling a reproduction unit for restoring an acoustic field so as to obtain a reproduced acoustic field of specific characteristics substantially independent of the intrinsic characteristics of reproduction of said unit, said reproduction unit comprising a plurality of reproduction elements, comprising:

a step of establishing a finite number of coefficients corresponding to the decomposition of said acoustic field to be reproduced into a linear combination of spatio-temporal functions, so that the coefficients are representative of the distribution in time and in the three dimensions in space of said acoustic field to be reproduced;

a step of determining reconstruction filters representative of said reproduction unit, comprising a substep of taking into account at least spatial characteristics of said reproduction unit, the spatial characteristics comprising the distance between the reproduction elements and a predetermined arbitrary center, and the angular position of the reproduction elements relative to the center;

a step of determining at least one control signal for said elements of said reproduction unit, said at least one signal being obtained by the application, to said coefficients, of said reconstruction filters; and a step of delivering said at least one control signal, with a view to an application to said reproduction elements so as to generate said acoustic field reproduced by said reproduction unit.

2. The method as claimed in claim 1, wherein said step of establishing a finite number of coefficients representative of the distribution of said acoustic field to be reproduced comprises:

a step consisting in providing an input signal comprising temporal and spatial information for a sound environment; and a step of shaping said input signal by decomposing said information over a basis of the spatio-temporal functions, this shaping step making possible to deliver a representation of said acoustic field to be reproduced corresponding to said sound environment in the form of a linear combination of said functions.

3. The method as claimed in claim 1, wherein said step of establishing a finite number of coefficients representative of the distribution of said acoustic field to be reproduced comprises:

a step consisting in providing an input signal comprising a finite number of coefficients representative of said acoustic field to be reproduced in the form of a linear combination of the spatio-temporal functions.

4. The method as claimed in claim 2, wherein said spatio-temporal functions are Fourier-Bessel functions.

5. The method as claimed in claim 1, wherein said substep of taking into account at least spatial characteristics of said reproduction unit is carried out at least with the help of parameters representative, for each element, of the three coordinates of its position with respect to the center placed in the listening zone, and/or of its spatio-temporal response.

6. The method as claimed in claim 5, wherein said substep of taking into account at least spatial characteristics of said reproduction unit is carried out moreover with the help:

of parameters describing, in the form of weighting coefficients, a spatial window which specifies the distribution in space of reconstruction constraints for the acoustic field; and of a parameter describing an order of operation limiting the number of coefficients to be taken into account during said step of determining reconstruction filters.

7. The method as claimed in claim 5, wherein said substep of taking into account characteristics of said reproduction unit is carried out moreover with the help:

of parameters constituting a list of the spatio-temporal functions whose reconstruction is imposed; and of a parameter describing an order of operation limiting the number of coefficients to be taken into account during said step of determining reconstruction filters.

8. The method as claimed in claim 5, wherein said step of taking into account at least spatial characteristics of said reproduction unit is carried out moreover at least with the help of one of the parameters chosen from the group consisting:

of parameters representative of at least one of the three coordinates of the position of each or some of the elements, with respect to the center placed in the listening zone;

of parameters representative of the spatio-temporal responses of each or some of the elements;

of a parameter describing an order of operation limiting the number of coefficients to be taken into account during said step of determining reconstruction filters;

of parameters constituting a list of spatio-temporal functions whose reconstruction is imposed;

of parameters representative of the templates of said reproduction elements;

of a parameter representative of the desired local capacity of adaptation to the spatial irregularity of the configuration of said reproduction unit;

of a parameter defining the radiation model for said reproduction elements;

of parameters representative of the frequency response of said reproduction elements;

of a parameter representative of a spatial window;

of parameters representative of a spatial window in the form of weighting coefficients; and of a parameter representative of the radius of a spatial window when the latter is a ball.

9. The method as claimed claim 5, further comprising a calibration step making possible to deliver all or part of the parameters used in said step of determining reconstruction filters.

10. The method as claimed in claim 9, wherein said calibration step comprises, for at least one of the reproduction elements:

a substep of acquiring signals representative of the radiation of said at least one element in the listening region; and a substep of determining spatial and/or acoustic parameters of said at least one element.

11. The method as claimed in claim 10, wherein said calibration step comprises:

a substep of emitting a specific signal to said at least one element of said reproduction unit, said acquisition substep corresponding to the acquisition of the sound wave emitted in response by said at least one element; and a substep of transforming said signals acquired into a finite number of coefficients representative of the sound wave emitted, so as to allow the carrying out of said substep of determining spatial and/or acoustic parameters.

12. The method as claimed in claim 10, wherein said acquisition substep corresponds to a substep of receiving a number of coefficients representative of the acoustic field generated by said at least one element in the form of a linear combination of spatio-temporal functions, which coefficients are used directly during said substep of determining spatial and/or acoustic parameters of said at least one element.

13. The method as claimed claim 9, wherein said calibration substep furthermore comprises a substep of determining the position in at least one of the three dimensions in space of said at least one element of said reproduction unit.

14. The method as claimed claim 9, wherein said calibration step furthermore comprises a substep of determining the spatio-temporal response of said at least one element of said reproduction unit.

15. The method as claimed claim 9, wherein said calibration step furthermore comprises a substep of determining the frequency response of said at least one element of said reproduction unit.

16. The method as claimed in claim 1, further comprising a step of simulating all or part of the parameters necessary for carrying out said step of determining reconstruction filters.

17. The method as claimed in claim 16, wherein said simulation step comprises:

a substep of determining missing parameters from among the parameters used during said step of determining reconstruction filters;

a plurality of calculation substeps making possible to determine the value or values of the missing parameter or parameters as defined previously as a function of the parameters received, of the frequency, and of predetermined default parameters.

18. The method as claimed in claim 17, wherein said simulation step comprises a substep of determining a list of elements of the reproduction unit that are active as a function of the frequency, and in that said calculation substeps are carried out just for the elements of said list.

19. The method as claimed claim 17, wherein said simulation step comprises a substep of calculating a parameter representative of the order of operation limiting the number of coefficients to be taken into account during said step of determining reconstruction filters with the help of at least the position in space of all or part of the elements of the reproduction unit.

20. The method as claimed claim 17, wherein said simulation step comprises a step of determining parameters representative of a spatial window in the form of weighting coefficients with the help of a parameter representative of the spatial window in the spherical reference frame and/or of a parameter representative of the radius of said spatial window when the latter is a ball.

21. The method as claimed in claim 17, wherein said simulation step comprises a substep of determining a list of spatio-temporal functions whose reconstruction is imposed with the help of the position of all or part of the elements of the reproduction unit.

22. The method as claimed in claim 1, further comprising a step of input making possible to determine all or part of the parameters used during said step of determining reconstruction filters.

23. The method as claimed in claim 1, wherein said step of determining reconstruction filters comprises:

a plurality of calculation substeps carried out for a finite number of frequencies of operation and making possible to deliver a matrix for weighting the acoustic field, a matrix representative of the radiation of the reproduction unit, and a matrix representative of the spatio-temporal functions whose reconstruction is imposed; and a substep of calculating a decoding matrix, carried out for a finite number of operating frequencies, with the help of the matrix for weighting the acoustic field, of the matrix representative of the radiation of the reproduction unit, of the matrix representative of the spatio-temporal functions whose reconstruction is imposed, and of a parameter representative of the desired local capacity of adaptation to the spatial irregularity of the reproduction unit, representative of the reconstruction filters.

24. The method as claimed in claim 23, wherein said calculation substep making possible to deliver a matrix representative of the radiation of the reproduction unit is carried out with the help of parameters representative for each element:

of the three coordinates of its position with respect to the center placed in the listening zone; and/or of its spatio-temporal response.

25. The method as claimed in claim 24, wherein said calculation substep making possible to deliver a matrix representative of the radiation of the reproduction unit is carried out moreover with the help of parameters representative for each element of its frequency response.

26. A computer readable storage medium tangibly embodying a program comprising program code instructions executable by a computer to control the computer to function as recited by the steps of the method as claimed claim 1.

27. A removable medium of the type comprising at least one processor and a nonvolatile memory element, wherein said memory comprises a program comprising instructions for the execution of the steps of the method as claimed claim 1, when said processor executes said program.

28. A device for controlling a reproduction unit for restoring an acoustic field, comprising a plurality of reproduction elements, further comprising at least:

means of determining reconstruction filters representative of said reproduction unit, adapted so as to make possible to take into account at least spatial characteristics of said reproduction unit; and means for determining at least one control signal for said elements of said reproduction unit, said at least one signal being obtained by application of said reconstruction filters to a finite number of coefficients representative of the distribution in time and in the three dimensions in space of said acoustic field to be reproduced, associated with means for shaping an input signal comprising temporal and spatial information for a sound environment to be reproduced, which means are adapted for decomposing said information over a basis of spatio-temporal functions so as to deliver a signal comprising said finite number of coefficients representative of the distribution in time and in the three dimensions in space of said acoustic field to be reproduced, corresponding to said sound environment, in the form of a linear combination of said spatio-temporal functions.

29. The device as claimed in claim 28, wherein said spatio-temporal functions are Fourier-Bessel functions.

30. The device as claimed claim 28, wherein said means for determining reconstruction filters receive as input at least one of the parameters from the following parameters:

parameters representative of at least one of the three coordinates of the position of each or some of the elements, with respect to the center placed in the listening zone;

parameters representative of the spatio-temporal responses of each of some of the elements;

a parameter describing an order of operation limiting the number of coefficients to be taken into account in the means of determining reconstruction filters;

parameters representative of the templates of said reproduction elements;

a parameter representative of the desired local capacity of adaptation to the spatial irregularity of the configuration of said reproduction unit;

a parameter defining the radiation model for said reproduction elements;

parameters representative of the frequency response of said reproduction elements;

a parameter representative of a spatial window;

parameters representative of a spatial window in the form of weighting coefficients;

a parameter representative of the radius of a spatial window when the latter is a ball; and parameters constituting a list of spatio-temporal functions whose reconstruction is imposed.

31. The device as claimed claim 28, wherein each of said parameters received by said means of determining reconstruction filters is conveyed by one of the signals from the group of the following signals:

a definition signal comprising information representative of the spatial characteristics of the reproduction unit;

a supplementary signal comprising information representative of the acoustic characteristics associated with the elements of the reproduction unit; and an optimization signal comprising information relating to an optimization strategy, so as to deliver, with the aid of the parameters contained in these signals, a signal representative of said reconstruction filters representative of said reproduction unit.

32. The device as claimed in claim 31, associated with means for determining all or part of the parameters received by said means for determining reconstruction filters, said means comprising at least one of the following elements:

simulation means;

calibration means;

parameters input means.

33. The device as claimed claim 28, wherein said means for determining reconstruction filters are adapted for determining a set of filters representative of the position in space of the elements of the reproduction unit.

34. The device as claimed claim 28, wherein said means of determining reconstruction filters are adapted for determining a set of filters representative of the room effect induced by the listening zone.

35. A method of controlling a reproduction unit for restoring an acoustic field so as to obtain a reproduced acoustic field of specific characteristics substantially independent of the intrinsic characteristics of reproduction of said unit, said reproduction unit comprising a plurality of reproduction elements, comprising:

a step of establishing a finite number of coefficients representative of the distribution in time and in the three dimensions in space of said acoustic field to be reproduced;

a step of determining reconstruction filters representative of said reproduction unit, comprising a substep of taking into account at least spatial characteristics of said reproduction unit;

a step of determining at least one control signal for said elements of said reproduction unit, said at least one signal being obtained by the application, to said coefficients, of said reconstruction filters; and a step of delivering said at least one control signal, with a view to an application to said reproduction elements so as to generate said acoustic field reproduced by said reproduction unit, wherein said step of establishing a finite number of coefficients representative of the distribution of said acoustic field to be reproduced comprises:

a step consisting in providing an input signal comprising temporal and spatial information for a sound environment; and a step of shaping said input signal by decomposing said information over a basis of spatio-temporal functions, this shaping step making possible to deliver a representation of said acoustic field to be reproduced corresponding to said sound environment in the form of a linear combination of said functions.

* * * * *